(12) United States Patent
Miyake et al.

(10) Patent No.: US 8,444,806 B2
(45) Date of Patent: May 21, 2013

(54) PLASMA GENERATOR, PLASMA CONTROL METHOD AND METHOD OF PRODUCING SUBSTRATE

(75) Inventors: Shoji Miyake, Suita (JP); Akinori Ebe, Kyoto (JP); Tatsuo Shoji, Nagoya (JP); Yuichi Setsuhara, Minoo (JP)

(73) Assignees: Japan Science and Technology Agency, Saitama (JP); Shoji Miyake, Osaka (JP); Akinori Ebe, Kyoto (JP)

( * ) Notice: Subject to any disclaimer, the term of this patent is extended or adjusted under 35 U.S.C. 154(b) by 0 days.

(21) Appl. No.: 12/836,161

(22) Filed: Jul. 14, 2010

(65) Prior Publication Data

US 2010/0304046 A1    Dec. 2, 2010

Related U.S. Application Data

(63) Continuation of application No. 10/539,254, filed as application No. PCT/JP03/16007 on Dec. 12, 2003, now Pat. No. 7,785,441.

(30) Foreign Application Priority Data

Dec. 16, 2002 (JP) ................. 2002-363988
Dec. 16, 2002 (JP) ................. 2002-363989
Jan. 23, 2003 (JP) ................. 2003-014718

(51) Int. Cl.
*C23C 16/00* (2006.01)
*C23C 15/00* (2006.01)
*H01L 21/306* (2006.01)
*H05H 1/24* (2006.01)

(52) U.S. Cl.
USPC ............. 156/345.48; 118/723 I; 118/723 AN; 216/68; 427/569

(58) Field of Classification Search
USPC ...... 156/345.48; 216/68; 427/569; 118/723 I, 118/723 AN
See application file for complete search history.

(56) References Cited

U.S. PATENT DOCUMENTS 5,472,561 A * 12/1995 Williams et al. ............... 438/10
5,795,429 A *  8/1998 Ishii et al. ................ 156/345.48

(Continued)

FOREIGN PATENT DOCUMENTS

EP    1 324 371 A1    7/2003
JP    6-342764 A      12/1994

(Continued)

OTHER PUBLICATIONS

English-language translation of Taiwanese Office Action, mailed Feb. 12, 2010.

(Continued)

*Primary Examiner* — Luz L. Alejandro
(74) *Attorney, Agent, or Firm* — Oliff & Berridge, PLC

(57) ABSTRACT

The present invention aims to provide a plasma generator capable of creating a spatially uniform distribution of high-density plasma. This object is achieved by the following construction. Multiple antennas are located on the sidewall of a vacuum chamber, and a RF power source is connected to three or four antennas in parallel via a plate-shaped conductor. The length of the conductor of each antenna is shorter than the quarter wavelength of the induction electromagnetic wave generated within the vacuum chamber. Setting the length of the conductor of the antenna in such a manner prevents the occurrence of a standing wave and thereby maintains the uniformity of the plasma within the vacuum chamber. In addition, the plate-shaped conductor improves the heat-releasing efficiency, which also contributes to the suppression of the impedance.

8 Claims, 15 Drawing Sheets

U.S. PATENT DOCUMENTS

| | | | |
|---|---|---|---|
| 6,027,601 | A | 2/2000 | Hanawa |
| 6,042,686 | A | 3/2000 | Dible et al. |
| 6,158,384 | A | 12/2000 | Ye et al. |
| 6,164,241 | A | 12/2000 | Chen et al. |
| 6,181,069 | B1 | 1/2001 | Tonotani et al. |
| 6,323,595 | B1 | 11/2001 | Tonotani et al. |
| 6,353,201 | B1 | 3/2002 | Yamakoshi et al. |
| 2001/0008171 | A1 | 7/2001 | Fukuda et al. |
| 2001/0021422 | A1 | 9/2001 | Yamakoshi et al. |
| 2002/0023718 | A1 | 2/2002 | Choi et al. |
| 2004/0027293 | A1 | 2/2004 | Miyake et al. |

FOREIGN PATENT DOCUMENTS

| | | |
|---|---|---|
| JP | 08-008096 A | 1/1996 |
| JP | 08-162291 A | 6/1996 |
| JP | 08-325759 A | 12/1996 |
| JP | 10-74597 A | 3/1998 |
| JP | A 10-233297 | 9/1998 |
| JP | 11-233289 A | 8/1999 |
| JP | 11-509358 A | 8/1999 |
| JP | 11-317299 A | 11/1999 |
| JP | 2000-003878 A | 1/2000 |
| JP | 2000-058296 A | 2/2000 |
| JP | 2000-058297 A | 2/2000 |
| JP | 2000-058465 A | 2/2000 |
| JP | 2000-073174 A | 3/2000 |
| JP | 2000-331993 A | 11/2000 |
| JP | 2000-345351 A | 12/2000 |
| JP | 2000-516405 A | 12/2000 |
| JP | A 2001-003174 | 1/2001 |
| JP | 2001-035697 A | 2/2001 |
| JP | 2001-094485 A | 4/2001 |
| JP | 2001-274099 A | 10/2001 |
| JP | 2002-260899 A | 9/2002 |
| JP | 2003-031504 A | 1/2003 |
| JP | 2003-502824 A | 1/2003 |
| JP | 2003-109798 A | 4/2003 |
| JP | 2004-039719 A | 2/2004 |
| JP | 2002-176035 A | 6/2006 |
| JP | 2010-3699 A | 1/2010 |
| TW | 502264 | 9/2002 |
| TW | 507256 | 10/2002 |
| TW | 510149 | 11/2002 |
| WO | WO 97/02589 | 1/1997 |
| WO | WO 97/16946 | 5/1997 |
| WO | WO 98/01893 | 1/1998 |
| WO | WO 98/56027 | 12/1998 |
| WO | WO 00/00993 | 1/2000 |
| WO | WO 00/79568 A3 | 12/2000 |

OTHER PUBLICATIONS

Taiwanese Decision of Rejection in Taiwanese Patent Application No. 092135000, dated Jun. 27, 2011, with English-language translation.

Taiwanese Decision of Rejection in Taiwanese Patent Application No. 099122626, dated Jun. 27, 2011, with English-language translation.

Chinese Office Action, with English-language translation, issued Sep. 30, 2010 for Chinese Application No. 200710162401.7.

Korean Office Action, with English-language translation, issued Apr. 27, 2011 for Korean Application No. 10-2005-7011022.

Korean Notification of Reason for Refusal, with English-language translation, issued Aug. 17, 2010 for Korean Application No. 10-2005-7011022.

Taiwanese Office Action, with English-language translation, issued Dec. 28, 2010 for Taiwanese Application No. 092135000.

Taiwanese Office Action, with English-language translation, issued Dec. 28, 2010 for Taiwanese Application No. 099122626.

Korean Office Action issued in Korean Patent Application No. 10-2011-7019922 mailed Oct. 10, 2011 with English-language translation.

Korean Office Action issued in Korean Patent Application No. 10-2011-7019923 mailed Oct. 10, 2011 with English-language translation.

Korean Office Action issued in Korean Patent Application No. 10-2011-7019924 mailed Oct. 10, 2011 with English-language translation.

Nov. 28, 2012 Office Action issued in European Patent Application No. 03 780 748.4.

European Search Report dated Mar. 4, 2013 from European Patent Application No. 10180427.6.

\* cited by examiner

CHANGE IN PLASMA ELECTRON DENSITY WITH RESPECT TO RF PHASE DIFFERENCE BETWEEN POWER SOURCES

ASPECT RATIO 2:1          1:1          1:2

US 8,444,806 B2

PLASMA GENERATOR, PLASMA CONTROL METHOD AND METHOD OF PRODUCING SUBSTRATE

This application is a continuation application of U.S. patent application Ser. No. 10/539,254 filed Jun. 16, 2005, which is a U.S. National Phase application of PCT Application No. PCT/JP2003/016007 filed Dec. 12, 2003, which claims priority to Japanese Patent Applications Nos. JP 2003-014718 filed Jan. 23, 2003, JP 2002-363988 filed Dec. 16, 2002 and JP 2002-363989 filed Dec. 16, 2002. The disclosure of each of these applications is hereby incorporated by reference in its entirety.

TECHNICAL FIELD

The present invention relates to a plasma generator for producing a semiconductor substrate or similar substrates by using plasma to carry out a deposition or etching process on the surface of a base plate to be processed. Particularly, the present invention relates to a technique for producing a substrate of a large area by uniformly generating a plasma over that area.

BACKGROUND ART

In recent years, the polysilicon TFT-LCD (Thin Film Transistor Liquid Crystal Display) is drawing people's attention because it is capable of displaying images with higher luminance than the TFT-LCD that uses amorphous silicon films. In the production of a polysilicon TFT-LCD, a glass plate is coated with a polysilicon film to create a polysilicon substrate. Then, the face of the polysilicon substrate is divided into a large number of picture elements arrayed in a two-dimensional pattern, and a thin film transistor is formed on each picture element to obtain an LCD substrate. To produce a polysilicon TFT-LCD having a large display area, it is necessary to create a high-quality polysilicon substrate that particularly has a high degree of evenness.

Polysilicon substrates are also gathering attention as a high-performance solar cell substrate. With the growing demand for and application of solar cells, it is necessary for the polysilicon substrate to have a larger area. Apart from that, ordinary substrates for semiconductor devices also need to be produced by a deposition process if their area is larger than a single crystal.

The production of substrates used in the aforementioned fields requires a treatment that uses plasma. This treatment includes the steps of depositing a material for the substrate onto a base plate to be processed and etching the surface of the same plate. Larger substrates require a greated degree of a plasma treatment system. The most serious problem for a large-scale system is the unevenness in the plasma treatment. To avoid this problem, the plasma density should be as uniform as possible over the entire area of the substrate. From the viewpoint of productivity, it is necessary to increase the plasma density so as to improve the deposition speed or the etching rate.

Examples of the methods of generating plasma include the ECR (electron cyclotron resonance) plasma, microwave plasma, the inductively coupled plasma and the capacity coupled plasma. In the inductively coupled plasma method, a radiofrequency (RF) voltage is applied to an induction coil serving as an antenna to create an induction electromagnetic field within the plasma generator, whereby plasma is produced. This method satisfies one of the aforementioned requirements: the generation of high-density plasma. With regard to the other requirement concerning the improvement in the uniformity of the plasma density, a variety of antennas differing in form, position and other factors have been proposed, taking into account the dependency of the plasma density on the distance from the antenna. For example, the Japanese Unexamined Patent Publication No. 2000-58297, which is referred to as the "Patent Document 1" hereinafter, discloses a technique in which the uniformity of the plasma intensity is improved by introducing an RF wave through a flat coil located on the outside of the ceiling of the plasma-generating chamber.

To produce a large size substrate using the above-described construction, it is necessary to adequately increase the wall thickness of the ceiling in the plasma-generating chamber to provide the ceiling with a sufficient mechanical strength. However, this makes it difficult for the system of Patent Document 1 to obtain an adequate strength of electromagnetic field within the plasma-generating chamber, because the antenna is located outside the plasma-generating chamber and the thick wall attenuates the induction electromagnetic field radiated from the antenna. In summary, the method disclosed in Patent Document 1 is effective in enhancing the uniformity of the plasma density to a certain extent but cannot adequately increase the plasma density.

To solve this problem, the inventors of the present patent application have proposed that the RF antenna should be located within the plasma-generating chamber, multiple antennas should be used, and each antenna should have a non-loop shape (i.e. a shape that does not completely surround a space), as disclosed in the Japanese Unexamined Patent Publication No. 2001-35697 ("Patent Document 2").

This construction enables the electromagnetic field to be fully radiated within the plasma-generating chamber without being attenuated by the wall of the chamber, so that the plasma density is adequately increased. Also, the equally spaced multiple antennas create a highly uniform radiation of electromagnetic field, which improves the uniformity of the plasma intensity. The use of multiple antennas makes the inductance of each antenna small enough to prevent an abnormal discharge, which often takes place if the antenna is located within the chamber and a high voltage is applied to the antenna. The non-loop shape of the antenna also reduces the inductance of the antenna and accordingly contributes to the suppression of the abnormal discharge. With these effects obtained, it is now possible to carry out a deposition process or etching process on a base plate of a large area. In the following description, the construction using multiple antennas as disclosed in Patent Document 2 is referred to as the "multi-antenna system."

To process a much larger substrate in the future, it is necessary to generate a plasma state with a higher degree of uniformity while ensuring an adequate level of plasma density. For that purpose, the multi-antenna system needs to be further examined with respect to the shape, position and other factors of each antenna, the relationship between the antennas, and other parameters that have not been considered. Also, it is possible that the electromagnetic field radiated from the antenna forms a standing wave, which deteriorates the uniformity of the plasma. Furthermore, the multi-antenna system still allows the plasma density to be lower at the central region of the substrate than at the marginal region because the strength of the electromagnetic field depends on the distance from the RF antenna. If the area of the substrate is small, the difference in plasma density between the central region and the marginal region of the substrate will be kept within the allowable range. However, the distance cannot be ignored for large substrates. Finally, the ion species or the radical species to be created must be also considered because the etching rate or the deposition speed varies depending on the ion species or the radical species.

To address the aforementioned problems, the present invention aims to provide a plasma generator capable of creating a spatially uniform distribution of high-density plasma and controlling the type of ion species or the radical species to be created.

DISCLOSURE OF THE INVENTION

To solve the above-described problems, the plasma generator according to the present invention includes:

a) a vacuum chamber;

b) a stage located within the vacuum chamber, on which a base plate is to be placed; and c) multiple RF antennas arranged substantially parallel to the stage within the vacuum chamber.

The plasma generator according to the present invention may preferably include one or more of the following five constructions:

(1) The antenna is a conductor whose length is shorter than the quarter wavelength of the RF wave.

(2) A plate-shaped conductor is connected to the multiple antennas in parallel. The distance between the point at which the power source for supplying power to the antennas is connected to the plate-shaped conductor and each point at which each antenna is connected to the plate-shaped conductor is shorter than the quarter wavelength of the RF wave.

(3) The aspect ratio of the antenna at a position corresponding to a target area of the stage is set at a value determined according to the plasma density or plasma electron energy desired for the target area. The "aspect ratio" hereby means the length of the antenna along the direction perpendicular to the inner wall divided by the length along the direction parallel to the inner wall.

(4) The electrodes of the antennas are arranged substantially parallel to the stage, and the adjacent electrodes of one or more pairs of adjacent antennas have the same polarity.

(5) Impedance elements are connected to the antennas. Preferably, the impedance elements have variable impedances.

The basic construction of the plasma generator according to the present invention is described. The plasma generator according to the present invention includes a vacuum chamber having an inner space that serves as the plasma-generating chamber. The inner space of the vacuum chamber is maintained at a predetermined degree of vacuum with a vacuum pump. Located in this vacuum chamber is a stage on which the base plate is to be placed.

Within the vacuum chamber, multiple RF antennas are located. For each antenna, one electrode is connected to a separately provided power source and the other is connected to the ground. In an example, the antennas are attached to the sidewall or ceiling wall of the vacuum chamber. These antennas are arranged substantially parallel to the stage.

When an RF power is supplied from the power source to the antennas, each antenna radiates the induction electromagnetic field, thereby generating plasma. According to the present invention, the antennas are arranged roughly parallel to the stage, so that the antennas are at approximately the same height from the stage. This arrangement enables the antennas to intensively supply energy into the space, thereby generating plasma with high density.

The flat arrangement of the antennas enables the energy to be intensively supplied from the antennas onto a plane area. Therefore, the plasma can have higher densities than in the case of using an antenna having a three-dimensional shape.

In the case the conductor of an antenna is located within the vacuum chamber, the conductor degrades because the surface of the antenna is exposed to the generated plasma. Therefore, it is preferable to coat the surface of the antenna with an insulator. This coating also has the effect of suppressing the electrostatic coupling between the conductor of the antenna and the plasma, thereby preventing an abnormal discharge or disorder of the plasma. This coating is described in detail in Patent Document 2.

The plasma generator having the aforementioned construction (1) is described. In this construction, the length of the conductor constituting each antenna is shorter than the quarter wavelength of the RF power supplied to the antenna. The conductor does not need to have a linear shape. For example, it may be shaped like a plate as long as its length measured in the direction of the current flow is shorter than the quarter wavelength of the RF wave. This construction prevents the formation of a standing wave on the surface of the conductor, so that the uniformity of the plasma within the vacuum chamber is maintained.

The plasma generator having the aforementioned construction (2) is described. In addition to the basic construction described previously, the multiple antennas are now connected to a plate-like conductor in parallel. Through the plate-shaped conductor, the RF power is supplied from the power source to the antennas. To efficiently supply the RF power to the antennas, it is necessary to reduce the impedance at the connection between the power source and the antennas. Use of the plate-shaped conductor having an adequate width suppresses the impedance at the connection. In addition, the plate-shaped conductor improves the heat-releasing efficiency, which also contributes to the suppression of the impedance by alleviating the increase in electric resistance that occurs when the temperature of the conductor at the connection rises because of the power supply.

In the construction (2), a standing wave may be formed between the point at which the power source supplying the power to the antennas is connected to the plate-shaped conductor and each point at which each antenna is connected to the plate-shaped conductor. If this occurs, the standing wave restricts the magnitude of the RF power supplied to the plate-shaped conductor at the connection point between the power source and the plate-shaped conductor. To prevent this situation, the distance between the two connection points is made shorter than the quarter wavelength of the RF wave. This prevents the standing wave from taking place in the plate-shaped conductor, so that the predetermined RF power can be supplied. It is further preferable that the sum of the length of the conductor of the antenna and the distance between the two connection points be smaller than the quarter wavelength of the RF power.

The plasma generator having the aforementioned construction (3) is described. This construction focuses on the aspect ratio of the antenna, which has not been previously considered. The inventors of the present patent application have found that the plasma electron energy or the plasma density at the area to which the antenna is directed (i.e. the area located in the direction perpendicular to the inner wall from the point where the antenna is attached) is dependent on the aspect ratio of an antenna. For example, with a constant RF voltage applied to the antenna, a larger aspect ratio leads to a higher level of plasma electron energy at the area to which the antenna is directed. The possible reason is as follows: The increased aspect ratio generates a stronger induction electric field in the direction of the antenna. This potential difference strongly accelerates the plasma electrons, which are generated around the antenna, along the direction of the antenna. This resultantly increases the plasma electron energy in the area located in the direction of the antenna.

The magnitude of the plasma electron energy affects the ion species or radical species created in the aforementioned area due to collisions with the plasma electrons. A change in the ion species or radical species in turn produces a different etching rate or some other parameter. Therefore, given a target area in which the etching rate or other parameter is to be controlled, it is possible to control the etching rate or other parameter by changing the aspect ratio of the antenna directed to the target area in order to regulate the plasma electron energy and control the ion species or radical species created in the target area.

The plasma generator having the construction (3) is capable of controlling the electron energy while maintaining the overall electron temperature in the vacuum chamber at a low level. This enables the electron energy at the target area to be controlled without raising the potential of the sheath, which does not contribute to the etching or deposition process.

Also, the increased aspect ratio further promotes the generation of the plasma by accelerating the plasma electrons and bringing them into collisions with the remaining molecules of the gas material that have not become plasma. Thus, the plasma density at the target area is further increased.

For a flat antenna having a rectangular, circular or other shape, the aspect ratio is defined as the length of the antenna along the direction perpendicular to the inner wall divided by the length along the direction parallel to the inner wall. For a three-dimensional antenna, a projection of the antenna onto a plane parallel to the stage is created and the aspect ratio is defined as the length of the projection along the direction perpendicular to the inner wall divided by the length along the direction parallel to the inner wall.

An example of controlling the plasma electron energy or plasma density in the plasma generator having the construction (3) is described. The aspect ratio of the antenna directed to a target area is determined according to the desired value of the plasma electron energy or plasma density for the target area. For example, if the plasma density is to be raised over the entire vacuum chamber, the aspect ratios of all the antennas are increased. If the plasma electron energy or plasma density at a specific area in the vacuum chamber is to be higher, the aspect ratio of the antenna directed to the target area is set larger than that of the other antennas. It is allowable to regulate the aspect ratio of more than one antenna. In the case the plasma electron energy or plasma density at a specific area in the vacuum chamber is to be decreased, the aspect ratio of the antenna directed to the target area should be lower than that of the other antennas. Thus, the plasma electron energy or plasma density can be controlled with a high degree of freedom.

As a typical example of increasing the plasma density at a specific area in the vacuum chamber, the above-described method can be used to increase the plasma density at the central region of the stage, at which the plasma density was lower than at the marginal region in the case of the conventional multi-antenna system. Setting the aspect ratio of an antenna directed to the central region larger than that of the other antennas improves the uniformity in the plasma density over the entire plasma-generating chamber. Using such plasma having an improved uniformity in density, it is possible to uniformly process a substrate over a large area by a deposition or etching process on a base plate.

The method of controlling the plasma density at a specific area in the vacuum chamber may be, for example, applicable to the case where the substrate has an uneven portion created for some reason. This problem can be solved by controlling the plasma density at the uneven portion so that the deposition speed or etching rate at that portion becomes different from that at the other portion.

The plasma generator having the aforementioned construction (4) is described. With the multiple antennas arranged in the vacuum chamber as in the previous case, the electrodes of the antennas are arranged substantially parallel to the stage, and the adjacent electrodes of the adjacent antennas have the same polarity. This means that both of the adjacent electrodes are connected to either the RF power source or the ground.

For example, suppose that an arrangement of the multiple antennas is obtained by placing plural antennas in such a manner that an antenna with one electrode connected to the RF power source and the other electrode connected to the earth is translated while maintaining its connections. In this case, the adjacent electrodes of the two adjacent antennas resultantly have different polarities. In contrast, if the arrangement of the multiple antennas can be obtained by translating the same antenna while reversing its connections to the RF power source and the ground from those of the adjacent antenna, the adjacent electrodes of two adjacent antennas resultantly have the same polarity.

In the case the adjacent electrodes of two adjacent antennas have different polarities, when an RF voltage is applied to the antennas for generating an induction electromagnetic field, the same voltage is also unexpectedly applied between the adjacent electrodes, causing the plasma density to be locally high only at that position. As a result, the plasma density becomes lower at the central region of the stage or some other region different from the region between the two adjacent electrodes. According to the construction (4), in contrast, the adjacent electrodes of two adjacent antennas have the same polarity. Even when an RF voltage is applied to the antennas, the voltage is not applied between the two adjacent electrodes because they are always at the same potential. Therefore, the aforementioned local region with higher plasma density does not take place between the two adjacent electrodes, and the plasma density is equalized. This construction also allows the adjacent antennas to be placed at narrower intervals and with a larger number of antennas per unit space without deteriorating the uniformity of the plasma density, so that the overall plasma density can be increased. It is also possible to control the plasma density distribution by appropriately selecting the combination of the electrodes whose polarity should be equal.

The plasma generator having the aforementioned construction (5) is described. In this construction, an impedance element for regulating the voltage or current of the antenna is connected to each antenna. In a typical case, the connection between the antennas and the RF power source is such that two or more antennas are connected in parallel to the same RF power source for the purpose of cost reduction or some other reason. However, it is possible to connect a separate RF power source to each antenna.

In the case the RF power is supplied from an RF power source to multiple antennas, the RF power supplied to each antenna changes from antenna to antenna depending on the form and the length of the conductor connecting the RF power source and the antenna, or on the temperature distribution. Particularly, if a plate-shaped conductor is used as the aforementioned conductor, the temperature distribution has a significant influence. Taking this into account, the plasma generator according to the present construction includes the impedance elements whose impedance values can be regulated so as to reduce the difference in the RF power supplied to the antennas. This improves the uniformity in the density of the plasma generated in the vacuum chamber.

For example, if the aforementioned plate-shaped conductor is used to connect the multiple antennas to the RF power source in parallel, the temperature of the plate-shaped conductor is lower at the edge than at the center due to the heat release from the surface. Therefore, the impedance value between the RF power source and the antenna connected close to the edge of the plate-shaped conductor becomes lower than that between the RF power source and the antenna connected to the central region of the plate-shaped conductor. Taking this into account, the impedance value of the impedance element connected to each antenna located close to the edge of the plate-shaped conductor is set higher. This setting reduces the difference in the impedance value between each antenna and the RF power source, so that the RF power supplied to the antennas is leveled.

Even if the plasma density at a specific area in the vacuum space is increased or decreased for some reason, the density at the area can be approximated to the value at the other area by regulating the impedance value of the impedance element corresponding to the antenna directed to the area concerned. This setting is also applicable to the case where each RF power source has only one antenna connected to it as well as to the case where multiple antennas are connected to the same RF power source in parallel.

It is also possible to connect the impedance element only to some of the antennas to regulate the voltage or current of those antennas. In an example, the maximum power is always supplied to some of the multiple antennas without using any impedance element, whereas the power supplied to the other antennas is restricted by regulating the impedance values of the impedance elements connected to them.

The impedance element connected to the antenna may have a fixed or variable impedance value. For example, the fixed impedance element can be used in the case where the impedance values between the RF power source and the antennas are known in advance and reproducible. In contrast, the variable impedance element can be used in the case where the impedance values between the RF power source and the antennas are unknown, dependent on the temperature or other conditions, or variable with time, in addition to the previous case. Regulating the impedance value of the variable impedance element according to various conditions and their changes enables the plasma to be uniform in density.

The impedance value of the variable impedance element is preferably regulated by a feedback process that monitors the state of the plasma within the vacuum chamber. This operation can deal with a temporal change of the plasma density resulting from the temperature change of the plate-shaped conductor. For this purpose, it is preferable to provide the plasma generator according to the present invention with a measurement unit for measuring a parameter indicative of the state of the plasma and a controller for setting the impedance value of each variable impedance element on the basis of the parameter. The measurement unit may directly determine the plasma density. Alternatively, it may measure the current or voltage for each antenna to indirectly determine the density of the plasma generated.

The measurement unit may be constructed as follows: The current in each antenna can be easily measured by installing a pick-up coil in proximity to the antenna and measuring the electromotive force induced in the pick-up coil. The voltage across each antenna can be easily measured by installing a capacitor in proximity to the antenna and measuring the current flowing into or out of the capacitor. Extending the ends of the conductor constituting the antenna to the outside of the vacuum chamber allows the pick-up coil or the capacitor to be located in proximity to the ends outside the vacuum chamber. This construction is capable of measuring the current or voltage of the antenna while preventing the pick-up coil or the capacitor from being eroded by the plasma.

The density of the plasma generated is proportional to the power supplied to the antenna. Therefore, to improve the accuracy of measuring the plasma density, it is preferable to measure both the current and the voltage of the antenna, i.e. the power supplied to the antenna, rather than to measure only one of them. The value of power can be obtained by multiplying the signal of the antenna current with the signal of the antenna voltage, both obtained by the methods described previously. The multiplication can be performed using, for example, a mixer that mixes the two signals. The signal produced by the mixer contains RF components, and these components should be preferably removed by a low-pass filter. The signal thus obtained is proportional to the power supplied to the antenna.

In any of the constructions described thus far, it is preferable to divide the multiple antennas into plural groups, each including one or more antennas, and to supply the RF power to each antenna in parallel within each group. Compared to the construction where the power is supplied from a single RF power source to all the antennas, the construction having the antenna groups reduces the load on the RF power source, so that a higher plasma density can be obtained.

The plasma generator having the constructions described thus far is capable of producing a plasma state having high densities with a higher level of uniformity than conventional plasma generators. Use of this plasma generator enables an efficient production of a substrate having a surface with a higher degree of flatness through the deposition process or etching process.

BEST MODE FOR CARRYING OUT THE INVENTION (First Embodiment)

Figure 1:
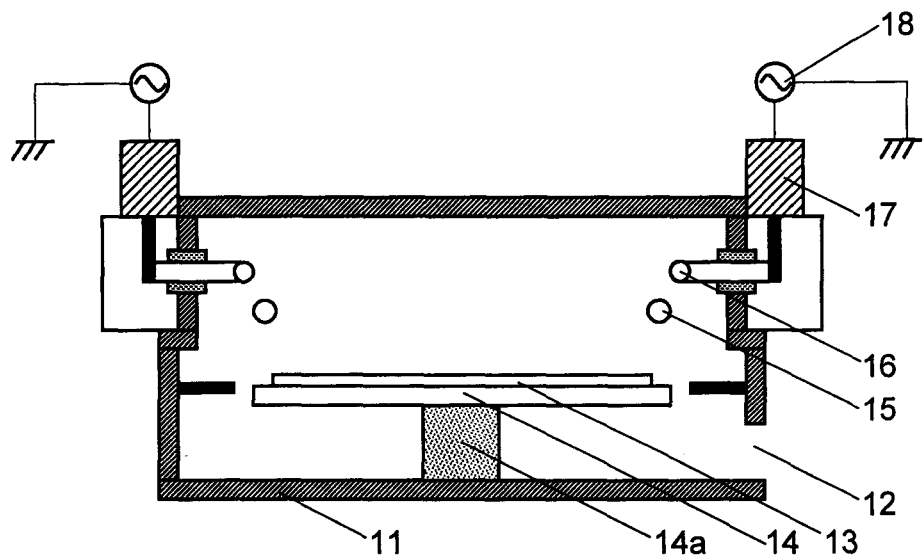
FIG. 1 is a vertical sectional view of a plasma generator as the first embodiment of the present invention.
Figure 2:
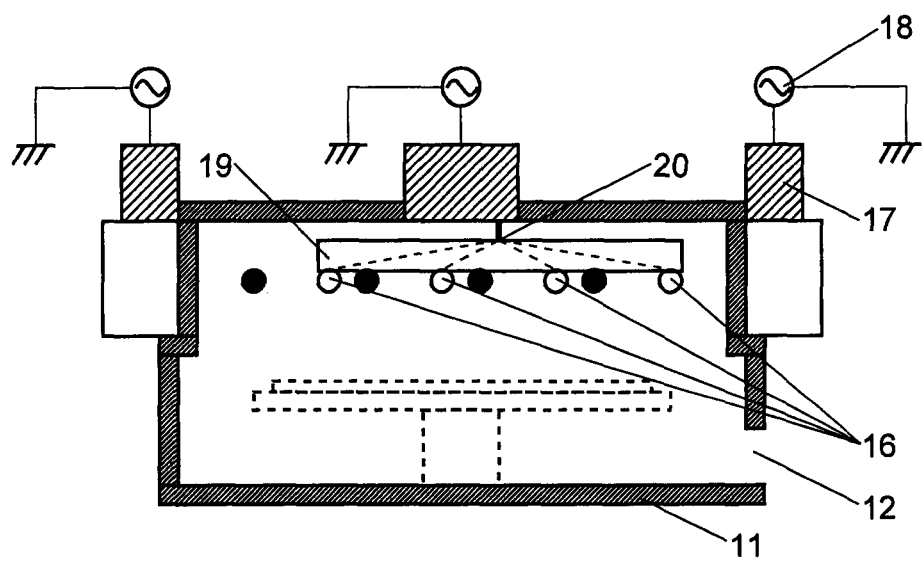
FIG. 2 is a side view of the plasma generator of the first embodiment.
Figure 3:
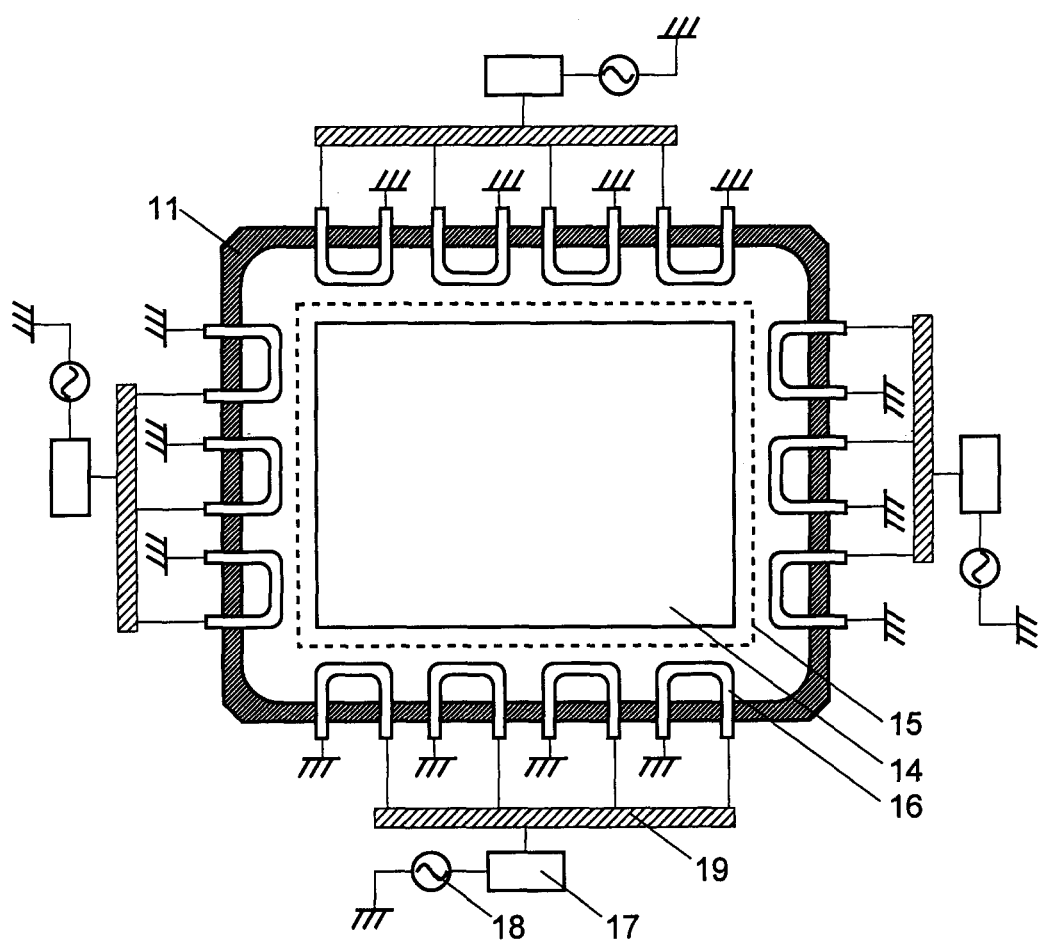
FIG. 3 is a plan view of the plasma generator of the first embodiment.

FIG. 1 is a vertical sectional view of a plasma generator as the first embodiment of the present invention, FIG. 2 is a side view of the plasma generator, and FIG. 3 is a plan view of the plasma generator.

In this plasma generator, the inner space of the vacuum chamber 11 serves as the plasma-generating chamber. As shown in FIG. 3, the horizontal shape of the inner space of the vacuum chamber 11 is rectangular, with the long side measuring 1300 mm and the short side 1000 mm. The inner space of the vacuum chamber 11 is maintained at a predetermined degree of vacuum with a vacuum pump (not shown) connected to the vacuum chamber 11. Located within the vacuum chamber 11 is a stage 14 with the long side measuring 94 cm and the short side 76 cm, on which a base plate 13 is to be placed. The stage 14 is equipped with an elevating unit 14a for moving the stage 14 in the vertical direction. At the bottom of the vacuum chamber 11, there is a doorway 12 through which the base plate 13 is inserted into or taken out of the chamber.

Located in the upper space of the vacuum chamber 11 is a gas pipe consisting of a circulating section making a horizontal turn along in the inner wall of the vacuum chamber 11 and a connection part that leads to the outside of the vacuum chamber 11. The gas pipe 15 has a large number of perforations arranged on the surface of the circulating section to evenly introduce a gas into the vacuum chamber 11. Alternatively, a short pipe penetrating the sidewall and/or the ceiling of the vacuum chamber may be used in place of the gas pipe 15 turning in the vacuum chamber 11 as in the present embodiment. In that case, it is preferable to use more than one pipe arranged on the sidewall and/or the ceiling in an appropriate pattern to evenly supply the gas into the vacuum chamber 11.

On the four sidewalls of the vacuum chamber 11, there are four pieces of RF antennas 16 located on each of the horizontally long sidewalls at equal intervals and three pieces of the antennas located on each of the short sidewalls (see FIG. 3). The antennas 16 are all located at a height of 180 mm from the stage 14. For each antenna 16, one of the two electrodes is connected to the RF power source 18 and the other is connected to the ground, as described later. In an example, the connection between one electrode of each antenna and the ground is achieved by connecting the electrode to the sidewall of the vacuum chamber 11 and then connecting the sidewall to the ground. It is also possible to connect a fixed or variable blocking condenser to the electrode in series on the side of the RF power source 18 so that the electrode is brought into a floating state with respect to the ground. In the present embodiment, the frequency of the power supplied from the RF power source 18 is 13.56 MHz.

The length of the conductor between the two electrodes of the antenna 16 is 450 mm, which is shorter than the quarter wavelength (10,000 to 15,000 mm) of the RF wave applied to the antenna 16. This design prevents the occurrence of a standing wave, which would deteriorate the uniformity of the plasma.

The portion of the conductor of the antenna 16 that is located within the vacuum chamber 11 is coated with an insulator. The RF antenna 16 is U-shaped; it does not form a complete turn. This shape reduces the inductance of the antenna. Detailed descriptions about the antenna coated with the insulator and the antenna having a non-loop shape are available in Patent Document 2.

In the present embodiment, the three or four pieces of antennas located on each sidewall of the vacuum chamber are connected to the same RF power source 18 in parallel. As shown in FIG. 2, each antenna 16 is connected via a plate-shaped conductor 19 to the RF power source 18. An example of the plate-shaped conductor 19 is a copper plate extending along the outside of the vacuum chamber 11. The RF power source 18 is connected via an impedance matcher 17 to a point ("power supply point 20") on the copper plate, and one of the electrodes of each antenna 16 (indicated by a white spot in FIG. 2) is also connected to the copper plate. The black spots in FIG. 2 denote the grounded electrodes. The distance between each electrode of the antenna 16 connected to the copper plate and the power supply point 20 is shorter than the quarter wavelength of the RF wave applied to the antenna 16. An increase in the width of the copper plate will allow the distance to be longer.

The plasma generator of the present embodiment operates as follows: The stage 14 is lowered with the elevating unit 14a. A base plate 13 is inserted through the doorway 12 into the vacuum chamber 11 and placed on the stage 14. Then, the stage 14 is raised to a predetermined position. After the pressure in the vacuum chamber is reduced to a predetermined level, the material gas of the plasma is introduced into the gas pipe 15 at a predetermined gas pressure, and a predetermined level of RF power is supplied from the four RF power sources 18 to the RF antennas 16. As a result, each of the RF antennas 16 creates an induction electric field, which generates the plasma.

The following description focuses on the plasma density or plasma electron energy generated in the plasma generator of the first embodiment, referring to the results of experiments.

Figure 4A:
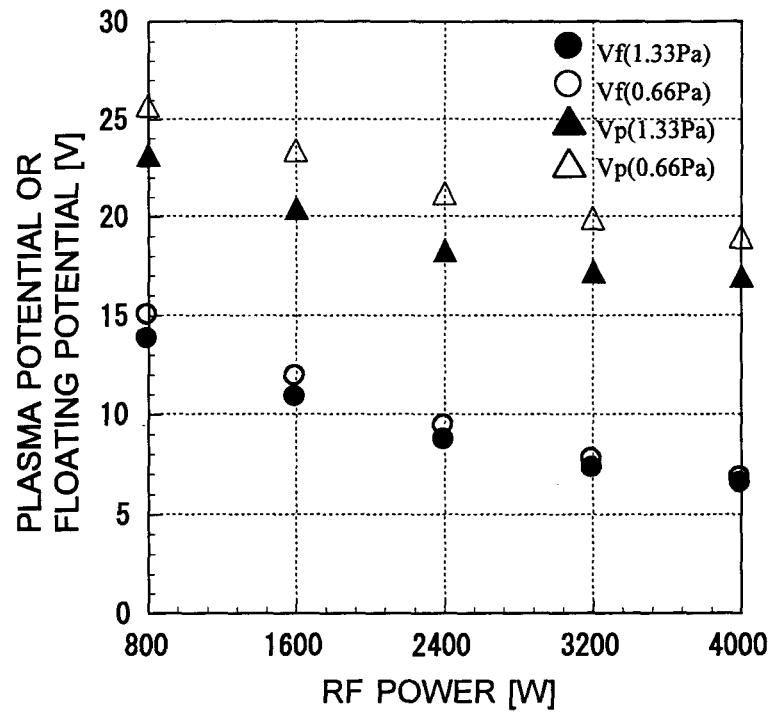
FIGS. 4A and 4B are graphs showing the state of the plasma at the center of the vacuum chamber, which was measured in the plasma generator of the first embodiment.
Figure 4B:
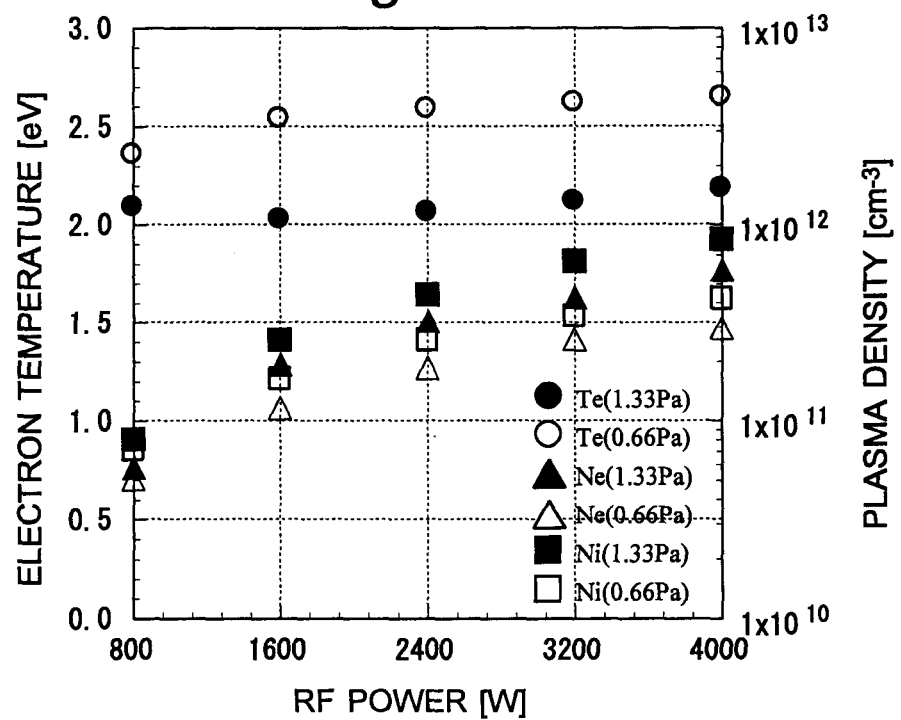

FIGS. 4A and 4B show the result of a measurement carried out using the plasma generator of the first embodiment, in which the plasma was produced from argon (Ar) and the plasma state at the center of the vacuum chamber 11 (a position 160 mm below the inner surface of the ceiling wall) was measured using the Langmuir probe method, under the condition that the flow rate of the argon gas is 50 ccm and the gas pressure is set to 0.66 Pascal and 1.33 Pascal. The data shown in FIG. 4A are the plasma potential Vp and the floating potential Vf measured for various values of the sum of the RF power supplied to all the antennas 16. The data shown in FIG. 4B are the plasma ion density Ni, the plasma electron density Ne and the plasma electron energy Te measured for the aforementioned various values of the sum of the RF power. The plasma potential Vp and the floating potential Vf decreases with the increase in the power supplied, while the plasma ion density Ni, the plasma electron density Ne and the plasma electron energy Te increase with the power. FIGS. 4A and 4B also proves that the plasma generator of the first embodiment is capable of generating plasma at a low plasma potential of 20V or lower with a high plasma density of $1\times10^{11}$ or higher. This density is appropriate for various types of plasma processes.

Figure 5A:
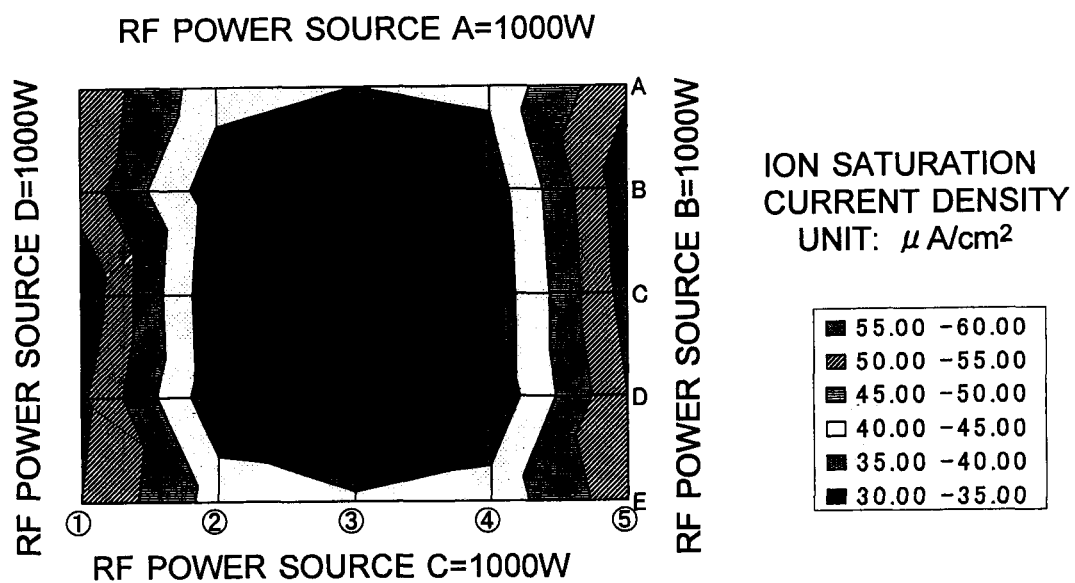
FIGS. 5A and 5B are illustrations showing the plasma density distribution within the vacuum chamber, which was measured in the plasma generator of the first embodiment.
Figure 5B:
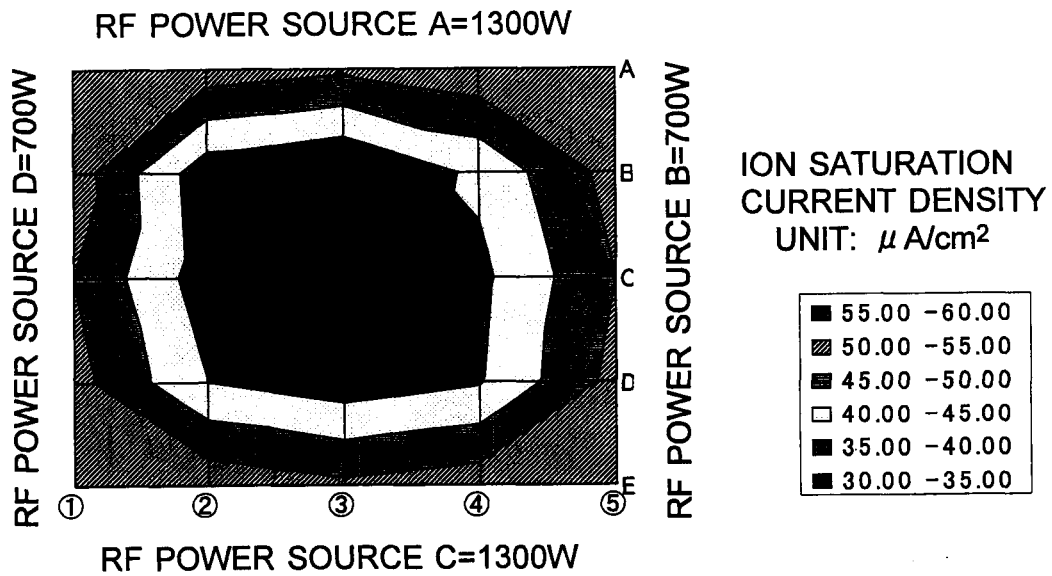

FIGS. 5A and 5B show the horizontal distribution (or uniformity) of the plasma density measured at a height of 195 mm down from the inner surface of the ceiling wall of the vacuum chamber 11. The measurement result was evaluated on the basis of the ion saturation current density obtained by the Langmuir probe method. The ion saturation current density corresponds to the plasma ion density. FIG. 5A shows the result of a measurement carried out using the plasma generator of the first embodiment, in which a power of 1000 W was supplied from each of the four RF power sources 18. In contrast, FIG. 5A shows the result of a measurement in which each of the RF power sources 18 having four antennas 16 connected to it generated a power of 1300 W while each of the RF power sources 18 having three antennas 16 connected to it generated a power of 700 W. The sum of the supplied power is 4000 W in both cases of FIGS. 5A and 5B. The degree of uniformity in horizontal distribution of the plasma density in FIG. 5B is higher than in FIG. 5B. Particularly, the plasma density in the area surrounded by the grids of B, 2, D, 4 is approximately uniform. This result shows that the plasma density distribution can be controlled by regulating the power supplied from each RF power source to the antennas.

Figure 6:
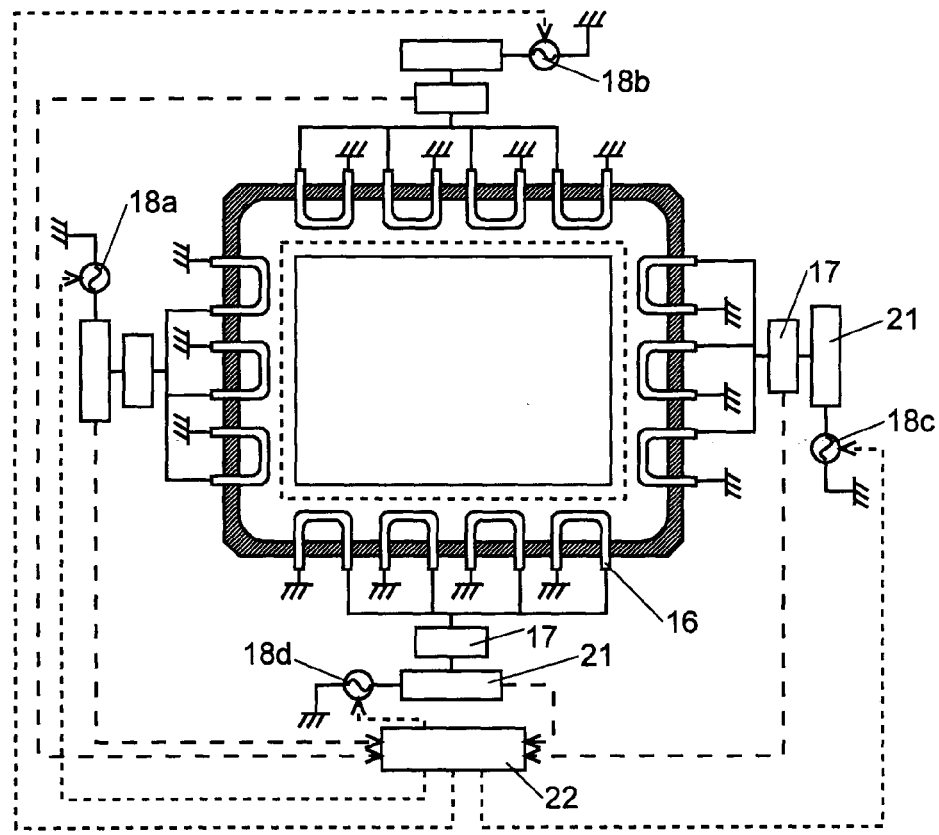
FIG. 6 is a schematic diagram of an example of a plasma generator having a phase-adjusting function.

FIG. 6 shows the construction of a plasma generator having the function of adjusting the phase of the RF power of each RF power source. This plasma generator is equipped with waveform detectors (or phase detectors) 21, each located at the output of the impedance matcher 19 provided for each of the RF power sources 18a-18d. At required intervals, the waveform detector 21 acquires the waveform of the RF power supplied to the antennas 16 and sends the waveform signal to a phase adjuster 22, which in turn detects the phase difference between the RF power sources 18. Based on the detection result, phase adjuster 22 sends a phase control signal to each of the RF power source 18 so that the phase difference is adjusted to a predetermined value. Each of the RF power sources 18 adjusts the phase of the RF power it generates.

Figure 7:
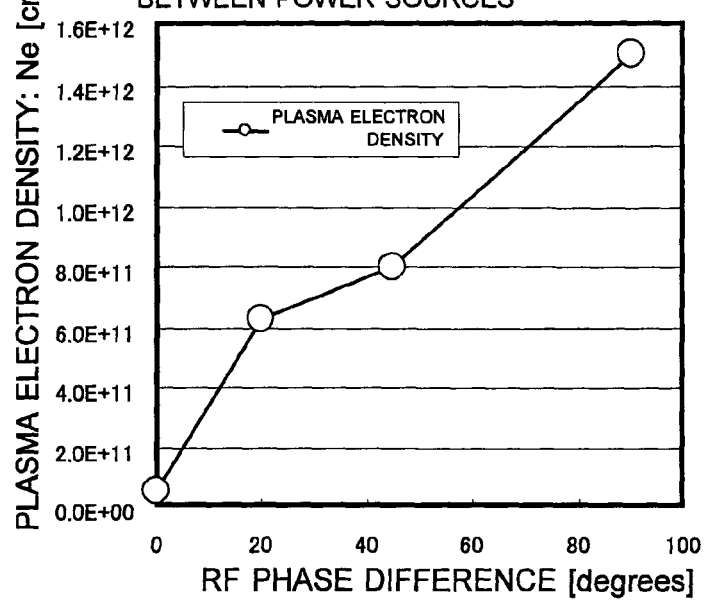
FIG. 7 is a graph showing the change in the plasma density observed when the phase difference between the RF power sources was changed.

FIG. 7 shows the result of a measurement carried out using the plasma generator of FIG. 6, in which the plasma density was measured for various values of the phase difference between the RF power sources. In FIG. 7, the coordinate axis indicates the plasma electron density Ne at a measurement point located close to the center of the vacuum chamber. The abscissa axis indicates the phase differences between the RF power sources 18a and 18b, 18b and 18c, and 18c and 18d. The result shows that the plasma density increased with the phase difference. This is probably because the phase difference between two antennas accelerated the electrons between the antennas and resultantly caused the increase in plasma density. The strength of accelerating the electrons should vary depending on the shape of the antenna, the distance between the antennas, the gas pressure, the size of the vacuum chamber 11 and other factors. Taking this into account, the phase difference is appropriately regulated so that the plasma density reaches the highest level.

Figure 8A:
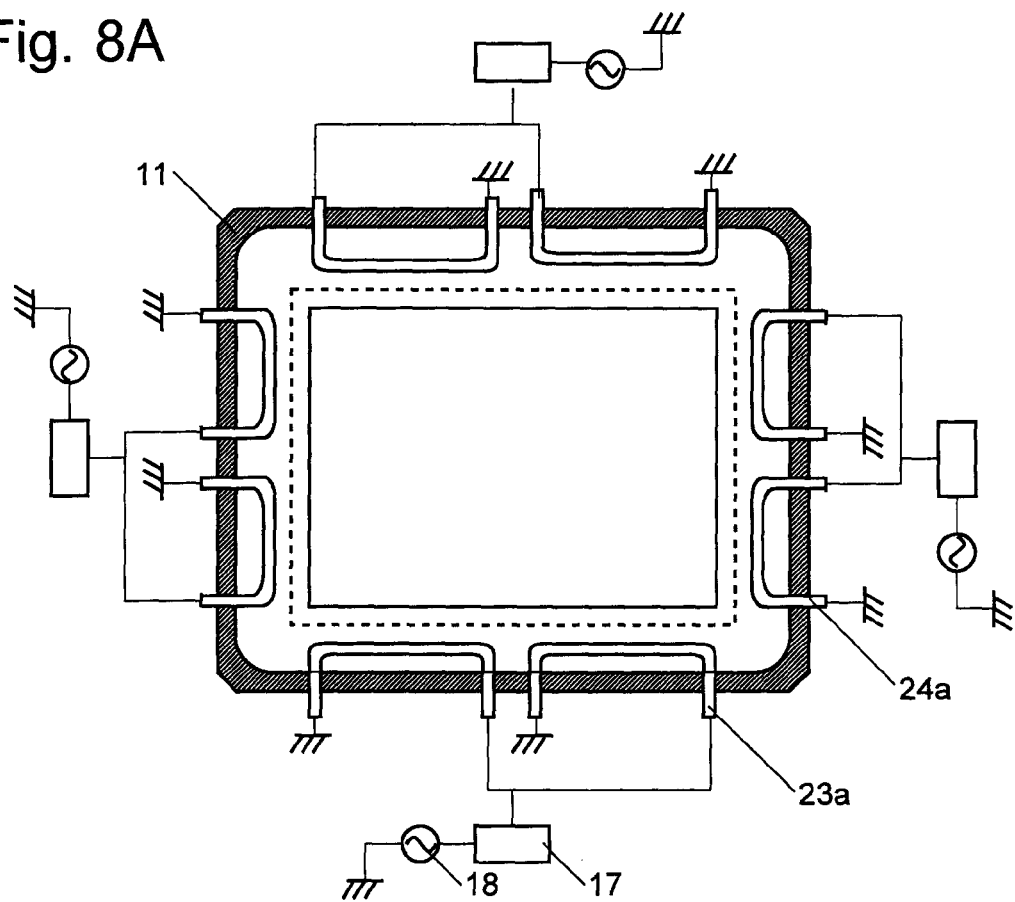
FIGS. 8A and 8B are plan views of plasma generators that differ from each other in the lengths of the conductors of the antennas measured along the side wall and in the number of the antennas.
Figure 8B:
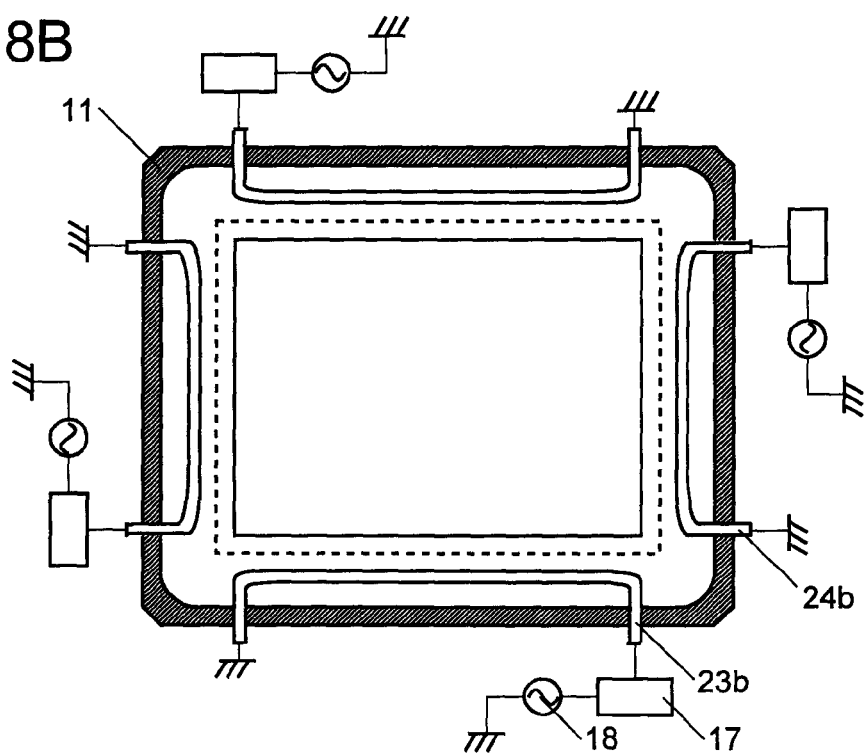

FIGS. 8A and 8B show examples of the plasma generator of the first embodiment, in which the length α of the conductor of the antenna along the direction of the sidewall is set longer while the number of the antennas is reduced. In FIG. 8A, the vacuum chamber is provided with two pieces of antennas 23a located on the inside of each of the longer sidewalls and two pieces of antennas 24a located on the inside of each of the shorter sidewalls, where the length a of the antenna 23a is 1.56 times as long as that of the antenna in FIG. 3 and the length a of the antenna 24a is 1.27 times. In FIG. 8B, the vacuum chamber has one antenna 23b on each of the insides of the longer sidewall and one antenna 24b on the inside of each of the shorter sidewalls, where the length a of the antenna 23b is 2.67 times as long as that of the antenna in FIG. 3 and the length a of the antenna 24b is 2.20 times. These constructions are accompanied by a larger inductance of the antenna due to the use of a longer conductor and an increased RF power supplied to each antenna increases because of the smaller number of the antennas.

Figure 9:
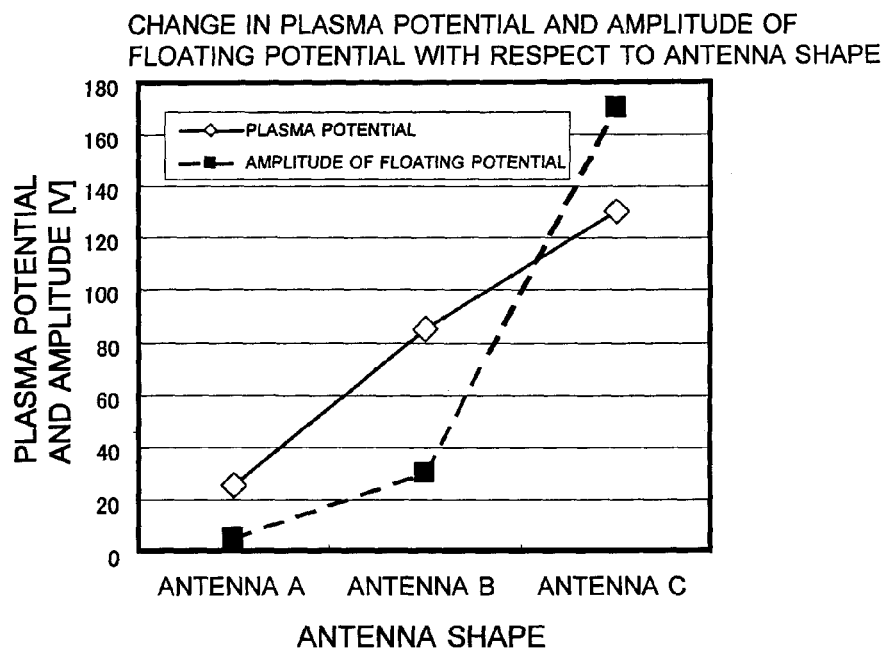
FIG. 9 is a graph showing the plasma potential and the amplitude of the floating potential, each of which changes with the lengths of the conductors of the antennas measured along the side wall and the number of the antennas.

FIG. 9 shows the result of a measurement using the plasma generators of FIGS. 3, 8A and 8B, in which the amplitudes of the plasma potential and the floating potential were measured. The use of longer conductors for the antennas and a smaller number of the antennas for each power source leads to larger amplitudes of the plasma potential and the floating potential. This is probably due to an increase in the impedance of the antennas and due to an increase in the potential of the antennas due to the smaller number of antennas for each power source. An increase in the amplitudes of the plasma potential and the floating potential may cause a heavier damage on the ions during the plasma process. However, it is still useful in the case of producing plasma of hydrogen, helium or other gases that have high ionization energies.

(Second Embodiment)

The plasma generator of the second embodiment is featured by the aspect ratio of the antennas, as described below.

Figure 10:
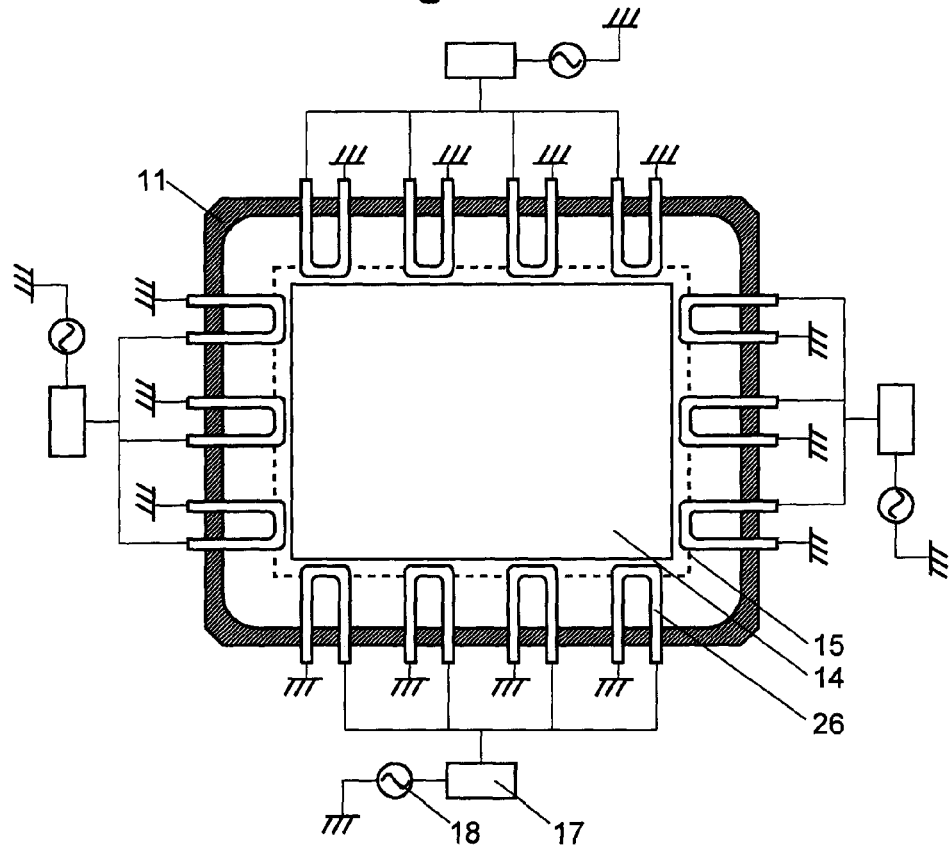
FIG. 10 is a plan view of a plasma generator as the second embodiment of the present invention.
Figure 11:
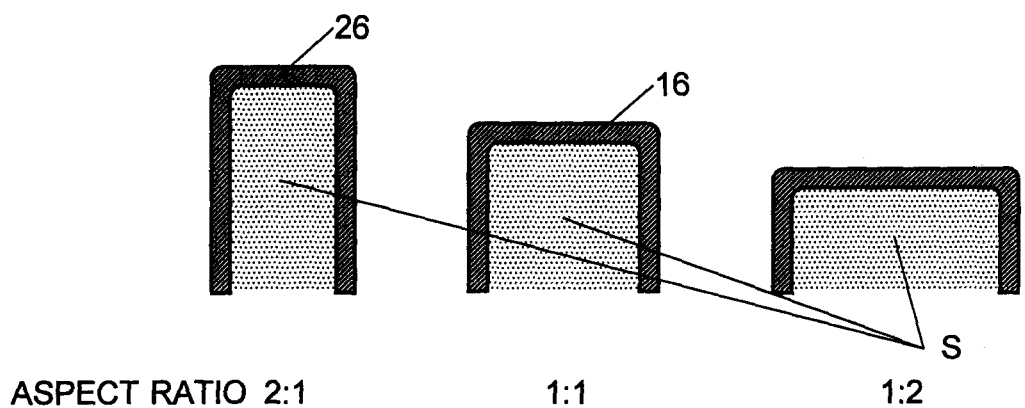
FIG. 11 is a schematic diagram of three antennas having different aspect ratios.

FIG. 10 is a plan view of the second embodiment. The construction of this plasma generator is identical to that of the first embodiment except for the antennas 26 having a different aspect ratio. Therefore, FIG. 10 uses the same numerals used in FIG. 3 for the components that are also present in the first embodiment. The number of the RF power sources and the number of the antennas connected to each RF power source are also the same as those in the first embodiment. In the plasma generator shown in FIG. 10, the aspect ratio of every antenna 26 is set to 2 (length: width=2:1), as shown in FIG. 11A, whereas the aspect ratio of the antenna 16 in the first embodiment is 1 (length: width=1:1), as shown in FIG. 11B. The area S enclosed by the conductor of the antenna 26 in the second embodiment is the same as that of the antenna 16 in the first embodiment.

The following description focuses on the plasma density or plasma electron energy generated in the plasma generator of the second embodiment, referring to the results of experiments. To examine the influence of the aspect ratio, the experiments were carried out using three types of the plasma generators having the aspect ratio of all the antennas set to 2 (the present embodiment using the antenna shown in FIG. 11A), 1 (the first embodiment using the antenna shown in FIG. 11B) and 0.5 (using the antenna shown in FIG. 11C), respectively. The length of each edge of the RF antenna having the aspect ratio of 1 was 15 cm. In this experiment, argon gas was supplied into the vacuum chamber up to a gas pressure of 1.33 Pascal, and an RF power with a frequency of 13.56 MHz was supplied to the antennas to generate argon plasma. The plasma density was measured by the Langmuir probe method.

Figure 12:
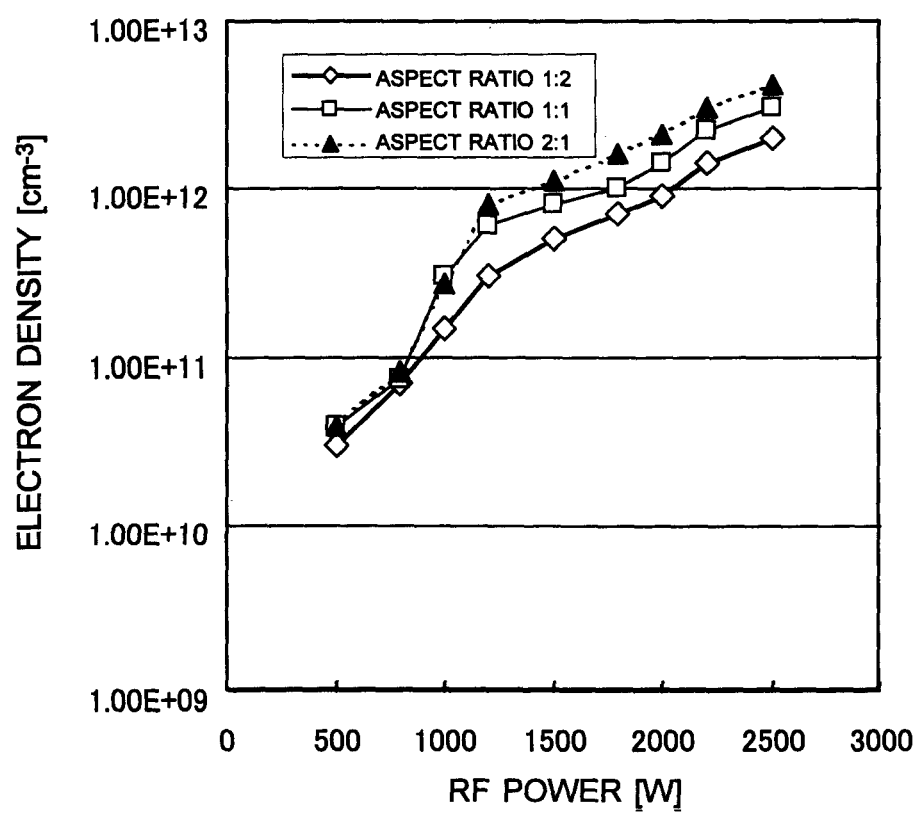
FIG. 12 is a graph showing the plasma density at the center of the vacuum chamber of the plasma generator of the second embodiment and that of the plasma generator used as a comparative example.

FIG. 12 shows the result of a measurement in which the plasma density was measured at the height equal to that of the RF antennas and above the center of the stage. The coordinate axis indicates the plasma density with a logarithmic scale and the abscissa axis indicates the magnitude of the RF power supplied from each RF power source. Under the condition that the RF power is constant, the plasma generator of the present embodiment using the RF antennas having the aspect ratio of 2 provides a higher plasma density than the other plasma generator using the RF antennas having the aspect ratio of 1 or 0.5.

Figure 13:
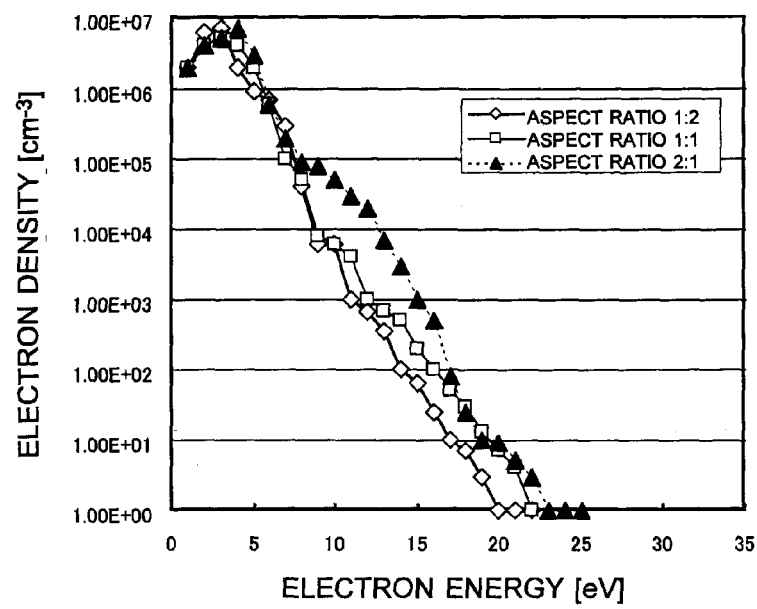
FIG. 13 is a graph showing the plasma electron energy at the center of the vacuum chamber of the plasma generator of the second embodiment and that of a comparative example.

FIG. 13 shows the result of a measurement in which the energy distribution of the plasma electrons was measured above the center of the stage, using the same three plasma generators as used in the measurement shown in FIG. 12. The magnitude of the RF power supplied from each RF power source was set to 2000 W. The setting of the other parameters was the same as in the measurement shown in FIG. 12. The coordinate axis is the logarithmic scale. Within the energy range of 10 to 18 eV, the plasma generator having the aspect ratio of 2 produces a greater number of plasma electrons than the other plasma generators having the other aspect ratios. These high-energy electrons result from the acceleration of electrons by the potential difference that takes place in the RF antenna. The traveling direction of these electrons is affected by the aspect ratio. In the U-shaped RF antenna used in the present embodiment, the high-energy electrons are created along the longitudinal direction of the RF antenna. Therefore, a greater number of high-energy electrons are observed in the case the aspect ratio is 2 than in the case the aspect ratio is 1 or 0.5.

The result shown in FIG. 13 also suggests that the energy of the electrons in the plasma can be controlled by changing the aspect ratio of the RF antennas. This also enables the control of the ion species, radical species or other factors that are important for the plasma process.

Figure 14:
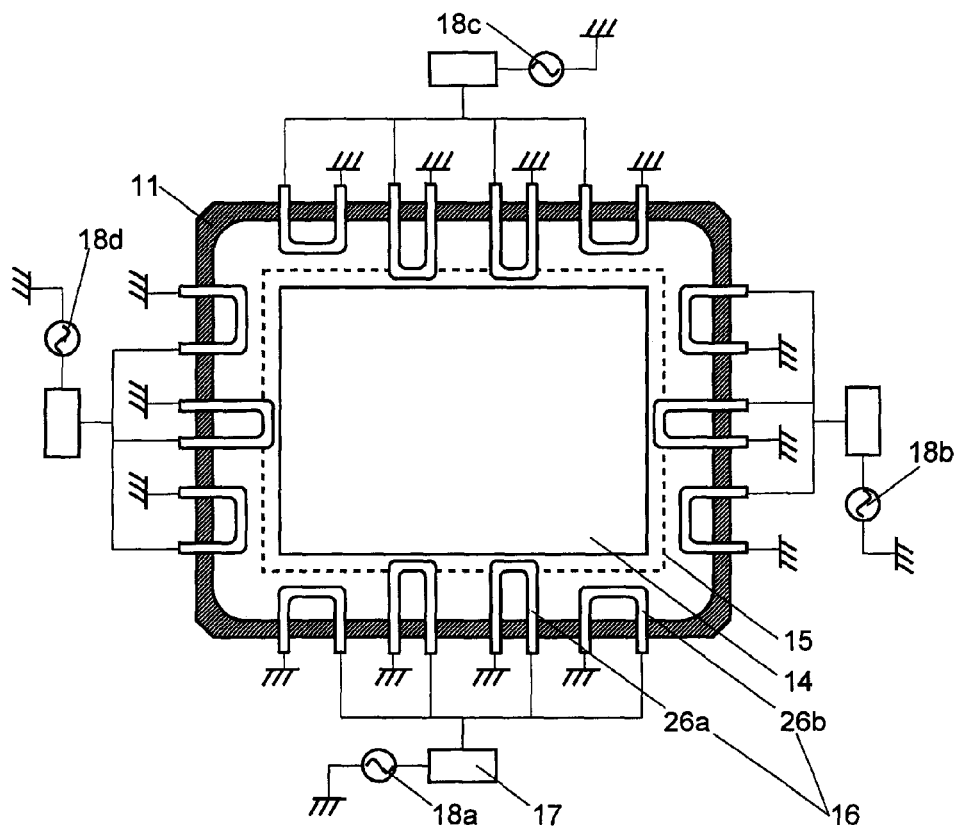
FIG. 14 is a plan view of an example of the plasma generator in which the antennas have different aspect ratios.

In the next example, the aspect ratio of each antenna is differently determined, as shown in the plan view of FIG. 14. In the plasma generator shown in FIG. 14, two of the four pieces of the RF antennas on each of the longer sidewalls of the vacuum chamber 11 are centrally located and have the aspect ratio of 2 (for example, the RF antenna 26a). Similarly, one of the three pieces of the RF antennas on each of the shorter sidewalls is centrally located and has the aspect ratio of 2. The other RF antennas located next to each of the four corners of the vacuum chamber 11 have the aspect ratio of 1 (for example, the antenna 26b).

The construction embodies the idea that the aspect ratio of the antennas directed to the center of the stage should be set larger than that of the other antennas in order to increase the plasma density at the target area, i.e. the center of the stage.

Figure 15A:
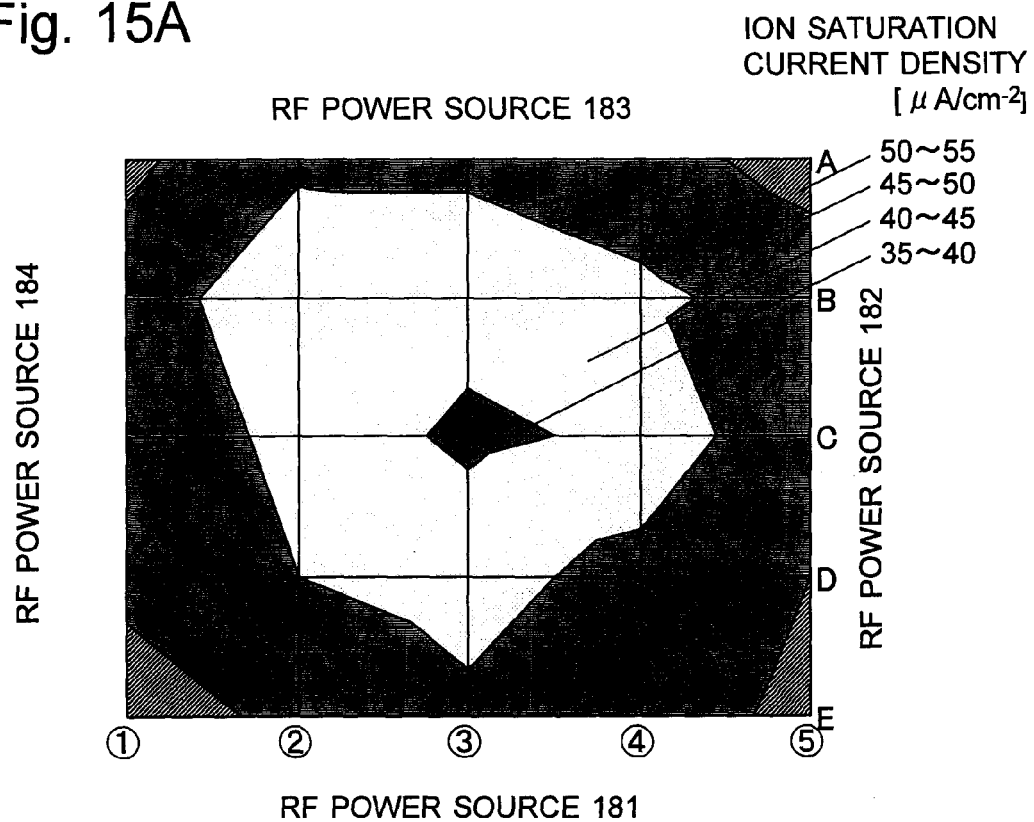
FIG. 15A is an illustration showing the plasma density distribution observed in the plasma generator of FIG. 14.
Figure 15B:
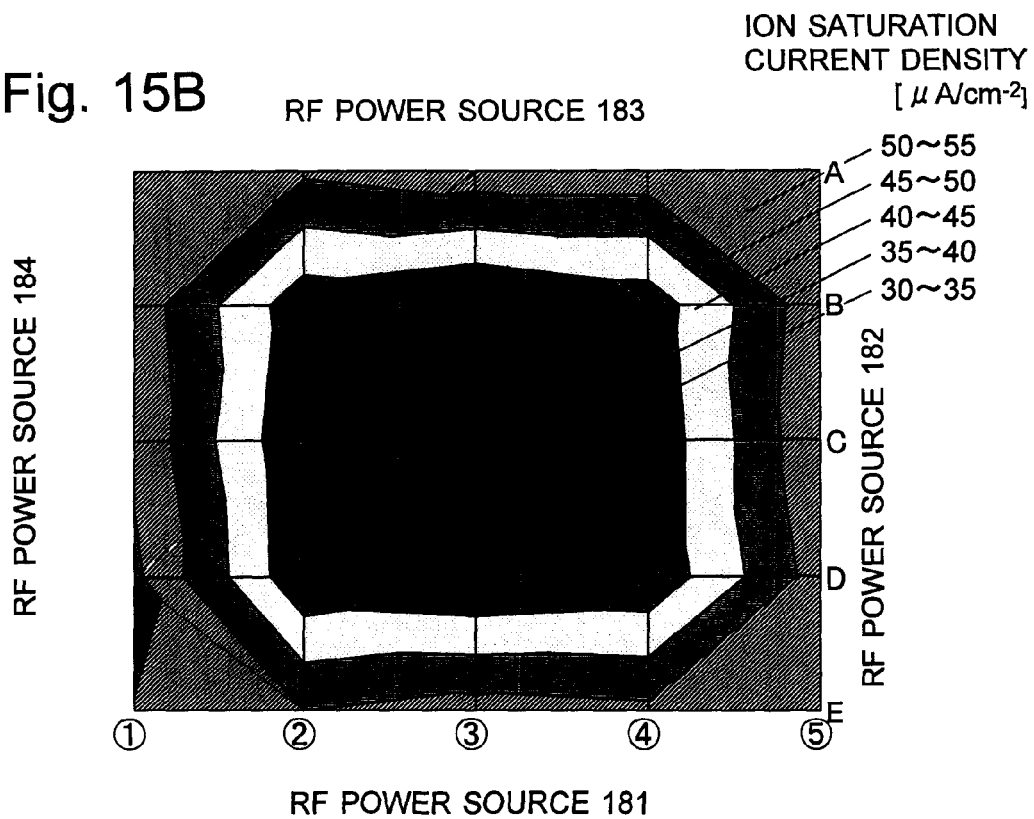
FIG. 15B shows that observed in the plasma generator used as a comparative example.

FIG. 15A shows the result of a measurement carried out using the plasma generator show in FIG. 14, in which the spatial distribution of the plasma density was measured at the height equal to that of the RF antennas. For comparison, FIG. 15B shows the result of the same measurement carried out using a plasma generator in which the entire RF antennas have an aspect ratio of 1. Each RF power source supplied an RF power of 1000 W. Other conditions relating to the generation of the plasma were the same as in the second embodiment. FIGS. 15A and 15B show that, in the plasma generator shown in FIG. 14, the plasma density at the central region is higher than that in the comparative example, whereas the increase in the plasma density at the marginal region is suppressed. As a result, the level of uniformity in the plasma density is higher than that in the comparative example.

(Third Embodiment)

The plasma generator of the third embodiment is featured by the polarities of the adjacent electrodes of two adjacent antennas, as described below.

Figure 16:
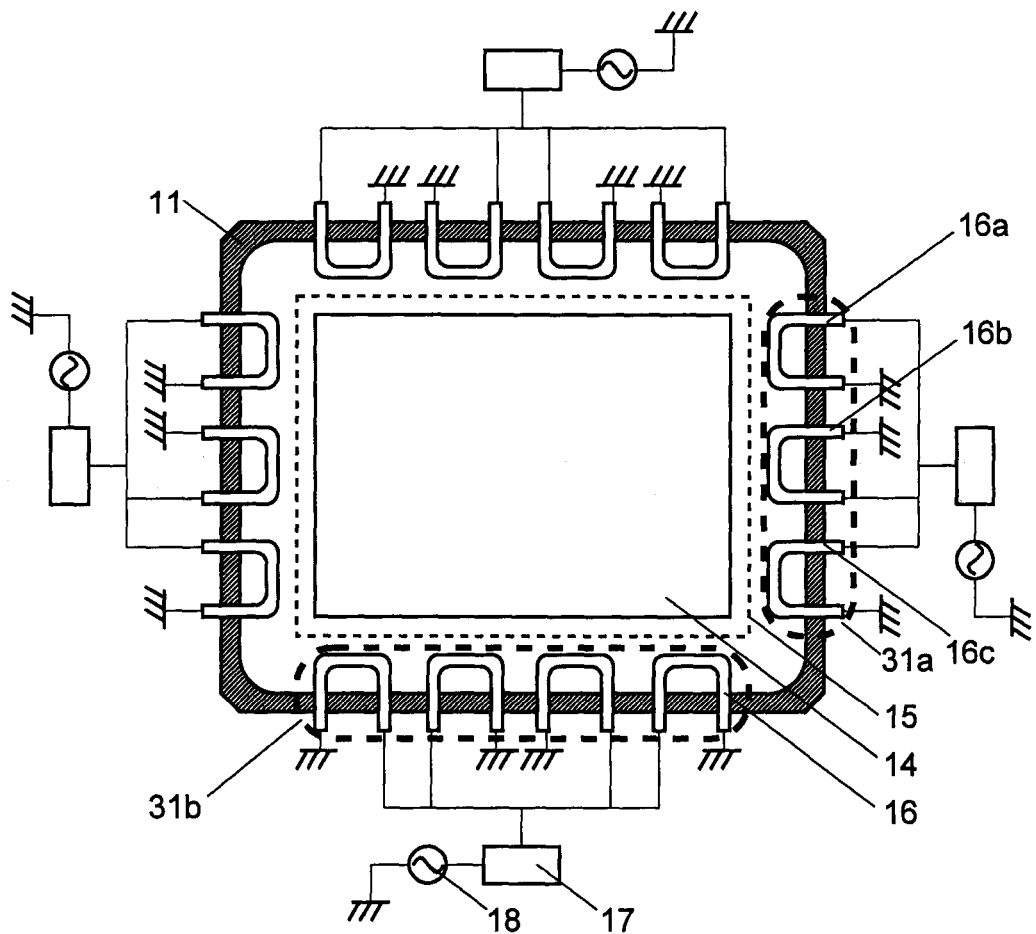
FIG. 16 is a plan view of a plasma generator as the third embodiment of the present invention.

FIG. 16 is a plan view of the third embodiment. The components that are present in the first embodiment are denoted by the same numeral as used in FIG. 3. The number of RF power sources and the number of antennas connected each RF power source are the same as in the first embodiment. The construction of the present plasma generator is identical to that in the first embodiment except for the RF antennas 16 whose electrodes have different polarities. More specifically, among each antenna group including three or four pieces of RF antennas located on the same sidewall, two adjacent electrodes of two adjacent RF antennas have the same polarity. Taking the antenna group 31a as an example, both of the two adjacent electrodes of the two adjacent RF antennas 16a and 16b are connected to the impedance matcher 17 and the RF power source 18, and the two adjacent electrodes of the two adjacent RF antennas 16b and 16c are connected to the ground.

Figure 17A:
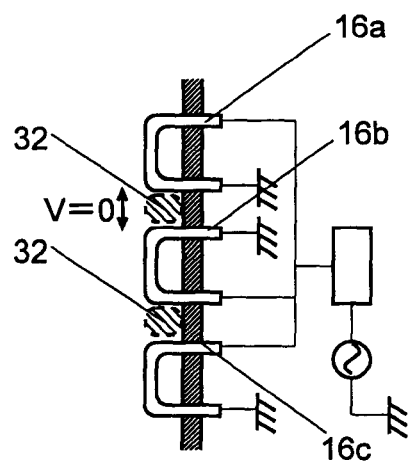
FIGS. 17A and 17B are diagrams for explaining the gap between adjacent antennas and the potential difference between them.
Figure 17B:
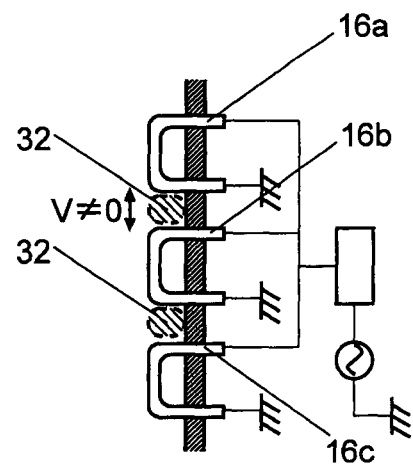

If, as shown in FIG. 17B, the adjacent terminals of adjacent RF antennas have different polarities, a potential difference takes place across the gap 32 between the adjacent electrodes of the adjacent antennas. Therefore, the plasma density at the gap 32 becomes higher than at the other positions. Accordingly, the plasma density at the other positions decreases. Conversely, in the plasma generator of the third embodiment, the adjacent terminals of adjacent RF antennas have the same polarity, so that the potential difference across the gap 32 between the adjacent electrodes is always zero. This construction prevents the increase in the plasma density that would take place across the gap 32 if a potential difference was present between the adjacent terminals. The decrease in the plasma density at the other region is also prevented.

The following description shows the result of a measurement in which the density of the plasma generated in the plasma generator of the third embodiment was measured. In this experiment, argon gas was supplied into the vacuum chamber up to a gas pressure of 1.33 Pascal, and an RF power with a frequency of 13.56 MHz was supplied to the antennas to generate argon plasma. Other conditions will be explained later when each measurement is described. The plasma density was measured by the Langmuir probe method.

Figure 18:
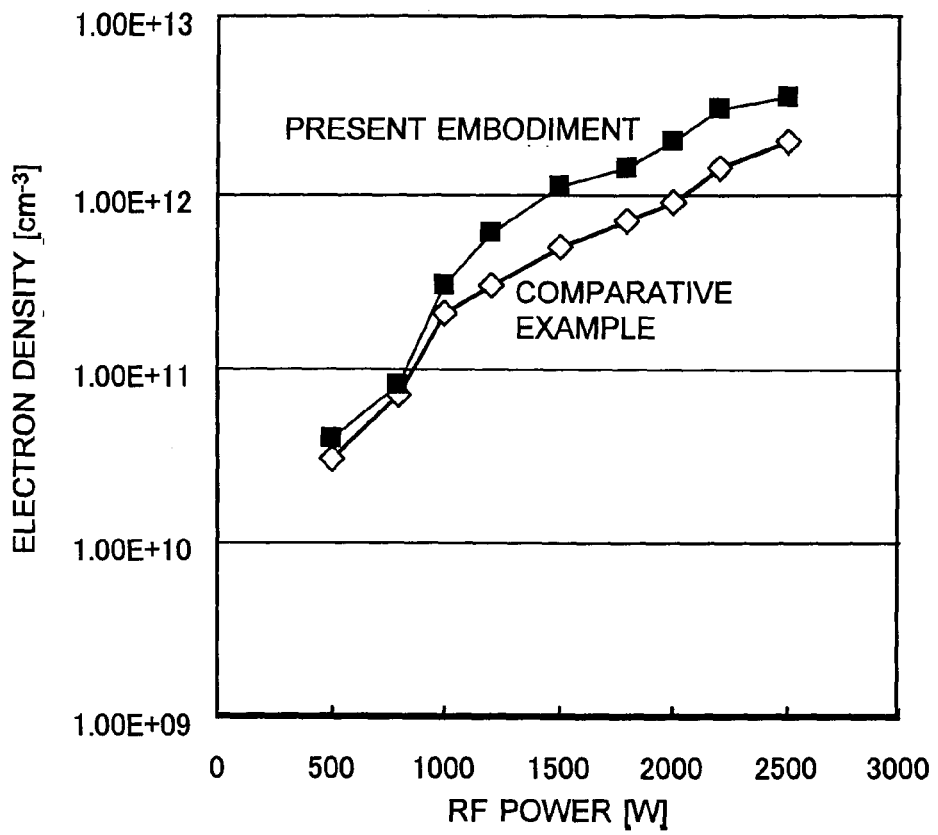
FIG. 18 is a graph showing the plasma density at the center of the vacuum chamber of the plasma generator of the third embodiment and that of the plasma generator used as a comparative example.

FIG. 18 shows the result of a measurement carried out using the plasma generator of the third embodiment, in which the plasma density was measured at the height equal to that of the RF antennas and above the center of the stage. FIG. 18 also shows the result of a measurement carried out using a plasma generator in which the adjacent electrodes were made to have different polarities for the purpose of comparison. The coordinate axis indicates the plasma density with a logarithmic scale and the abscissa axis indicates the magnitude of the RF power supplied from each RF power source. For any value of the RF power, the plasma generator of the present embodiment provides higher plasma densities than the plasma generator of the comparative example. Particularly, when the value of the RF power is in the range from 1200 W to 2500 W, the density of the plasma generated in the present embodiment is approximately twice as high as that in the comparative example.

Figure 19:
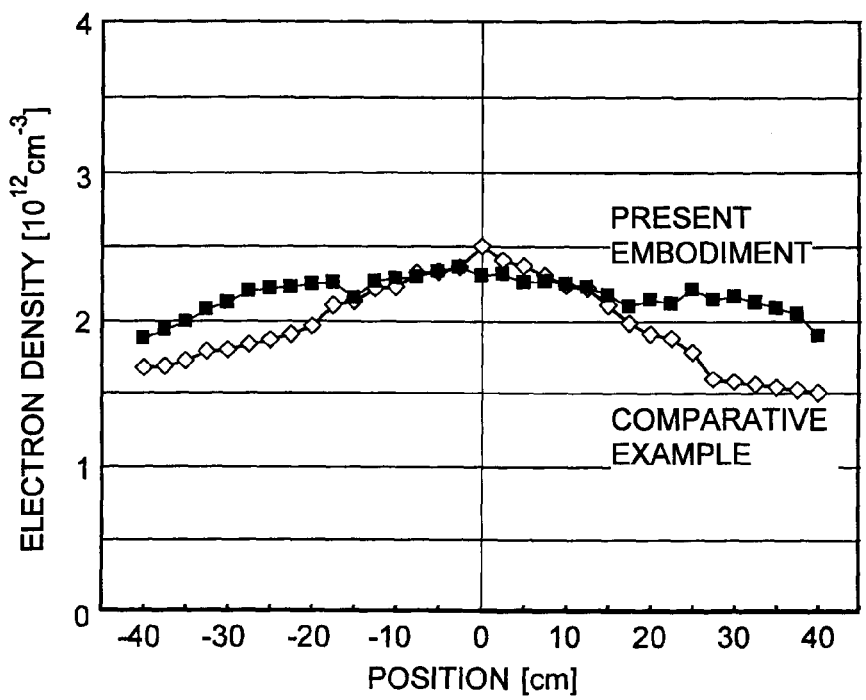
FIG. 19 is a graph showing the spatial distribution of the density of the plasma generated by the plasma generator of the third embodiment and that of the plasma generator used as a comparative example.

FIG. 19 shows the result of a measurement of the spatial distribution of the plasma density. The measurement conditions are as follows: The RF power is supplied only to the antenna group 31b shown in FIG. 16. The magnitude of the RF power supplied from the RF power source is 1500 W. The abscissa axis in FIG. 19 indicates the points at which the plasma density was measured. These points lie on a horizontal line parallel to and at a distance of 13 cm from the sidewall on which the antenna group 31b is located. FIG. 19 shows that, in the plasma generator of the comparative example, the plasma density at the ends is lower than that measured at the center; the spatial distribution of the plasma density is uneven. In contrast to the comparative example, the unevenness in the spatial distribution of the plasma is reduced in the plasma generator of the present embodiment. Thus, the uniformity in the spatial distribution of the plasma density is improved.

(Fourth Embodiment)

The plasma generator of the second embodiment is featured by an impedance element connected to the antenna, as described below.

Figure 20:
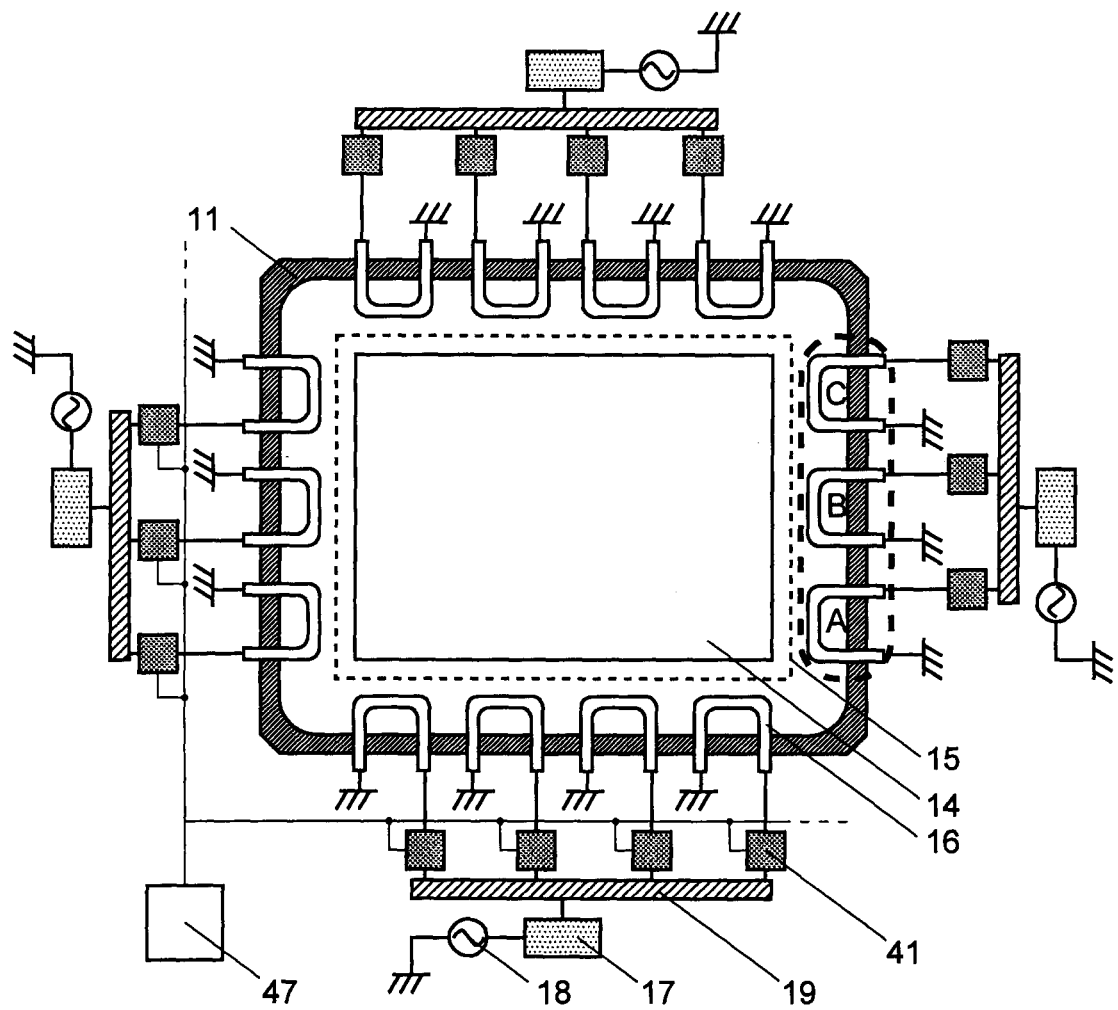
FIG. 20 is a plan view of a plasma generator as the fourth embodiment of the present invention.
Figure 21:
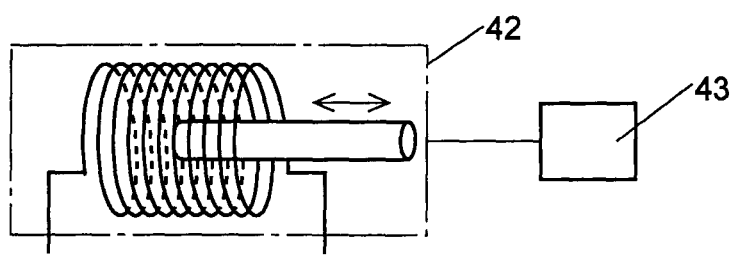
FIG. 21 is a diagram showing an example of the impedance element.

FIG. 20 is a plan view of the fourth embodiment. The components that are present in the first embodiment are denoted by the same numeral as used in FIG. 3. The number of RF power sources and the number of antennas connected each RF power source are the same as in the first embodiment. In addition to the construction of the first embodiment, the present plasma generator includes an impedance element 41 inserted between one of the electrodes of each RF antennas 16 and the impedance matcher 17. For example, the variable inductance coil 42 shown in FIG. 21 can be used. The inductance value of the variable inductance coil 42 may be manually regulated. However, for the feedback control described later, it is preferable to use a driver 43 to automatically regulate the inductance value. In this embodiment, the impedance element 41 is connected to the electrode of the antenna 16 on the side of the RF power source 20, which may be otherwise connected to the grounded electrode.

Figure 22:
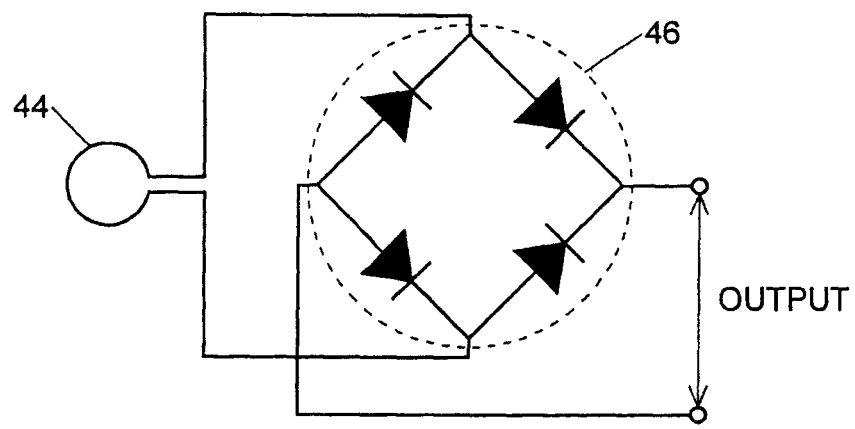
FIG. 22 is a vertical section of the plasma generator of the fourth embodiment.
Figure 23:
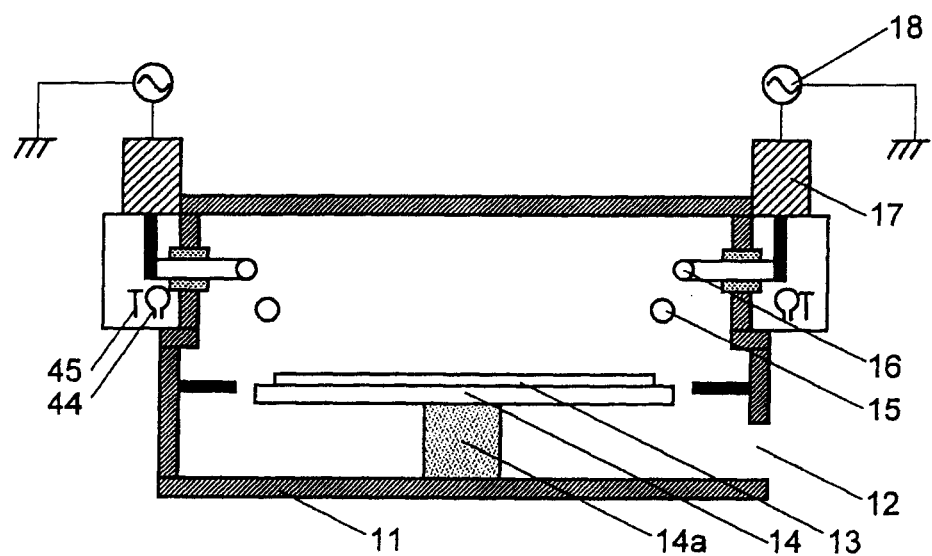
FIG. 23 is a diagram showing an example of the diode bridge circuit.

In the fourth embodiment, a pick-up coil 44 and a capacitor 45 are installed as shown in the vertical sectional view of FIG. 23. A portion of the RF antenna 16 is projected to the outside of the vacuum chamber 11. Therefore, the pick-up coil 44 and the capacitor 45 may be preferably located close to the projected portion so that they may not be eroded by the plasma. The pick-up coil 44, which is used to measure the current, can be located either on the grounded side or on the power-supplied side of the antenna 16. A bridge circuit 46, as shown in FIG. 22, is connected to each of the pick-up coil 44 and the capacitor 45 to convert the alternating-current (AC) signal generated by the pick-up coil 44 and the capacitor 45 into a direct-current (DC) signal. Alternatively, a wave detector that detects an AC signal and generates a DC signal may be used in place of the bridge circuit. In addition, there is a controller 47 that receives the aforementioned signals and generates a signal for regulating the impedance value of the impedance element 41 (FIG. 20).

In the present embodiment, if an uneven distribution of the plasma density occurs due to a temperature distribution of the copper plate 19 or for some other reason, the plasma generator equalizes the plasma density by regulating the impedance value of each impedance element 41 to appropriately control the power supplied to each RF antenna 16. Fixed impedance elements may be used if the plasma distribution observed is reproducible and the desirable impedance value can be identified through experiments or in some other way. In the case the distribution of the plasma density varies depending on the gas used, the power supplied or other factors and the distribution is reproducible under the same conditions, it is possible to use variable impedance elements and set the impedance values according to the conditions. If the change or reproducibility of the plasma density distribution depending on the conditions is not clear, the impedance value of the variable impedance element should be regulated by a feedback control based on the plasma density distribution.

The aforementioned feedback control is carried out as follows: The controller 47 receives a current signal from the pick-up coil 44 and/or a voltage signal from the capacitor 45 located at each antenna. For any one of the antennas, if one of the signals, or a signal indicating the power obtained by multiplying the two signals together, has exceeded a predetermined value, or if the plasma density around the antenna concerned has exceeded the a predetermined value, the controller 47 sends a signal for increasing the impedance to the driver 43 corresponding to the impedance element 41 connected to the aforementioned antenna. Conversely, if the current signal or other signal observed at an antenna is below a predetermined value, the controller 47 sends a signal for decreasing the impedance to the driver 43. Upon receiving a signal from the controller 47, the driver 43 sets the impedance of the corresponding impedance element to a predetermined value. Thus, the plasma density around the impedance element is maintained within a predetermined range.

The following description relates to an experiment in which the density distribution of the plasma generated by the plasma generator of this embodiment was measured. In this experiment, the RF power was supplied only to the three antennas A, B and C surrounded by the broken line in FIG. 20. The plasma density was measured along a line at a distance of 13 cm from the sidewall of the vacuum chamber on which the aforementioned three antennas were located, using the Langmuir probe method. The plasma generated in the experiment was argon plasma. Argon gas was supplied to a gas pressure of 1.33 Pascal, and RF power of 2000 W and 13.56 MHz was supplied from a single RF power source to the three antennas A, B and C.

Figure 24:
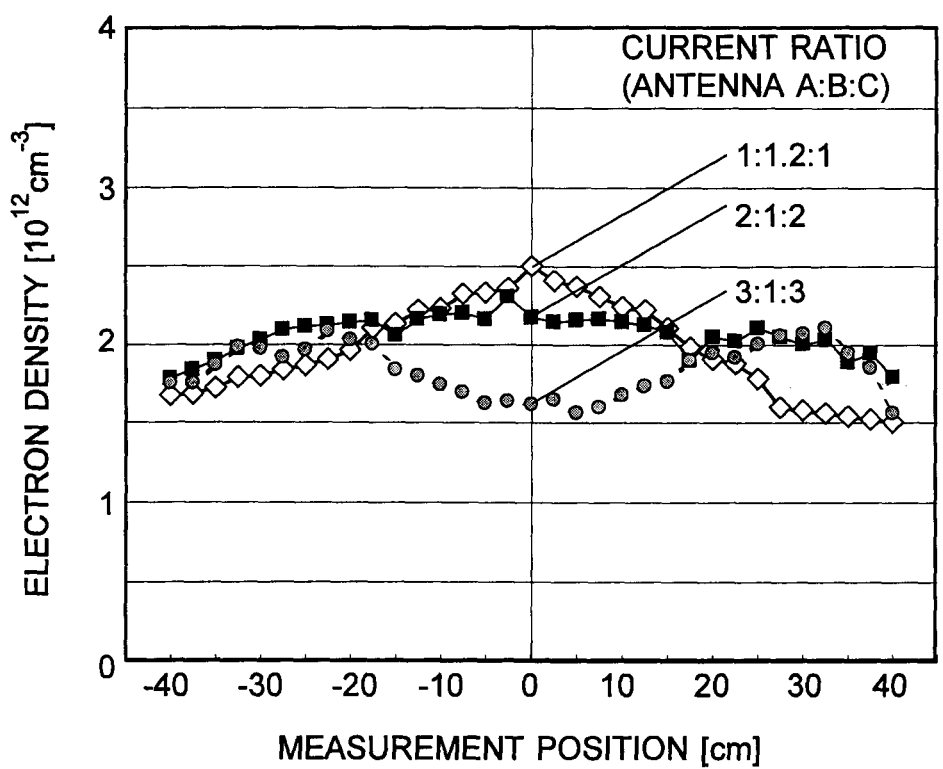
FIG. 24 is a graph showing the spatial distribution of the density of the plasma generated by the plasma generator of the fourth embodiment.

The plasma density was measured under three conditions in which the ratio of the magnitudes of the currents flowing through the antennas A, B and C was 1:1.2:1, 2:1:2 and 3:1:3, respectively. These conditions were created by regulating the impedance value of each impedance element according to the signal from the pick-up coil 44. FIG. 24 shows the measurement result. In the case the current ratio is 1:1.2:1, the currents flowing through the three antennas are almost equal, and the plasma density is higher at the center than at the marginal region. In the case the current ratio is 2:1:2, the currents flowing through the RF antennas located at both ends are increased, and the plasma density decreases at the center and increases at the marginal region. Thus, the uniformity of the plasma density is improved.

In the case the current ratio is 3:1:3, in which the currents flowing through the RF antennas at both ends are further increased, the plasma density is low at the center, in contrast to the case of the current ratio 1:1.2:1.

The current ratio that provides the optimal distribution of the plasma density depends on the type and the pressure of the plasma gas, the power supplied from the RF power source and other factors. Therefore, the impedance value of each impedance element should be appropriately regulated so that the current ratio takes the optimal values corresponding to the conditions.

In the embodiments described thus far, the horizontal shape of the vacuum chamber is rectangular, which may be alternatively shaped circular or otherwise. Also, some or all of the antennas may be located on the ceiling of the vacuum chamber, as opposed to the foregoing embodiments in which the antennas are located on the sidewalls of the vacuum chamber.

The invention claimed is:

1. A plasma generator comprising:
   a) a vacuum chamber;
   b) a stage located within the vacuum chamber on which a base plate is to be placed; and
   c) multiple U-shaped RF antennas arranged substantially parallel to the stage within the vacuum chamber,
   wherein an aspect ratio of a U-shaped RF antenna directed to a center of the stage is larger than that of other U-shaped RF antennas while areas enclosed by conductors of the multiple U-shaped RF antennas are constant, the aspect ratio defined as a length of the RF antenna along a direction perpendicular to an inner wall divided by a length of the RF antenna along a direction parallel to the inner wall.

2. The plasma generator according to claim 1, wherein the RF antennas are attached on one or both of a sidewall and a ceiling wall of the vacuum chamber.

3. The plasma generator according to claim 1, wherein a surface of the RF antennas is coated with an insulator.

4. The plasma generator according to claim 1, wherein the shape of the RF antennas within the vacuum chamber is flat.

5. The plasma generator according to claim 1, wherein each of the multiple RF antennas are divided into groups each including one or more RF antennas, and a RF power is supplied to each RF antenna in parallel within each group.

6. A method of producing a substrate, wherein plasma of a material is generated by a plasma generator according to claim 1 and the material is deposited.

7. A method of producing a substrate, wherein an etching process is carried out using plasma generated by a plasma generator according to claim 1.

8. A plasma control method comprising:
   providing a plasma generator having multiple U-shaped RF antennas located within a vacuum chamber, said antennas being arranged on one or both of a sidewall and a ceiling wall of the vacuum chamber and substantially parallel to a stage on which a base plate is to be placed,
   wherein an aspect ratio of a U-shaped RF antenna directed to a center of the stage is set to a larger value than that of other U-shaped RF antennas while areas enclosed by conductors of the multiple U-shaped RF antennas are constant, the aspect ratio defined as a length of the RF antenna along a direction perpendicular to an inner wall divided by a length of the RF antenna along a direction parallel to the inner wall.

* * * * *